United States Patent
Lee et al.

(10) Patent No.: US 12,431,084 B2
(45) Date of Patent: Sep. 30, 2025

(54) DISPLAY DEVICE AND METHOD OF MANUFACTURING SAME

(71) Applicant: LG Display Co., Ltd., Seoul (KR)

(72) Inventors: Jungeun Lee, Paju-si (KR); Chulho Kim, Paju-si (KR); Namkook Kim, Paju-si (KR); Sungwoo Choi, Paju-si (KR); Hwankeon Lee, Paju-si (KR); Youngkyun Moon, Paju-si (KR); Jihun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/504,844

(22) Filed: Nov. 8, 2023

(65) Prior Publication Data
US 2024/0081119 A1 Mar. 7, 2024

Related U.S. Application Data

(62) Division of application No. 17/130,730, filed on Dec. 22, 2020.

(30) Foreign Application Priority Data

Dec. 31, 2019 (KR) .................. 10-2019-0179737

(51) Int. Cl.
*H10K 59/131* (2023.01)
*G09G 3/3233* (2016.01)
(Continued)

(52) U.S. Cl.
CPC ......... *G09G 3/3233* (2013.01); *H10K 50/824* (2023.02); *H10K 59/131* (2023.02);
(Continued)

(58) Field of Classification Search
CPC ............. H10K 59/1315; H10K 59/122; H10K 59/1201; H10K 71/00; H10K 50/824
(Continued)

(56) References Cited

U.S. PATENT DOCUMENTS

| 9,412,801 B2 | 8/2016 | Choi |
| 9,881,987 B2 | 1/2018 | Choi |

(Continued)

FOREIGN PATENT DOCUMENTS

| CN | 103022371 A | 4/2013 |
| CN | 104716156 A | 6/2015 |

(Continued)

OTHER PUBLICATIONS

China National Intellectual Property Administration, Office Action, Chinese Patent Application No. 202011526925.1, Dec. 15, 2023, 20 pages.
(Continued)

*Primary Examiner* — Dzung Tran
(74) *Attorney, Agent, or Firm* — Fenwick & West LLP

(57) ABSTRACT

The present disclosure relates to a display device and a method of manufacturing the same, the display device including: a substrate including a pixel area and a non-pixel area adjacent to the pixel area; a power line formed on the substrate; at least one insulation layer covering the power line; a connection electrode formed on the at least one insulation layer, and connected to the power line through a contact hole; an overcoat layer placed above the connection electrode in the pixel area; and a first electrode placed above the overcoat layer, wherein the connection electrode has at least an area formed in the non-pixel area, and the first electrode extends to the non-pixel area and is connected to the connection electrode.

10 Claims, 14 Drawing Sheets

(51) Int. Cl.
    *H10K 50/824*    (2023.01)
    *H10K 59/80*    (2023.01)
    *H10K 71/00*    (2023.01)
    *G09G 3/20*    (2006.01)
    *G09G 3/3225*    (2016.01)
    *H10K 59/12*    (2023.01)
    *H10K 59/122*    (2023.01)

(52) U.S. Cl.
    CPC ... *H10K 59/1315* (2023.02); *H10K 59/80522* (2023.02); *H10K 71/00* (2023.02); *G09G 3/2003* (2013.01); *G09G 3/3225* (2013.01); *G09G 2310/08* (2013.01); *G09G 2330/00* (2013.01); *H10K 59/1201* (2023.02); *H10K 59/122* (2023.02)

(58) Field of Classification Search
    USPC .......................................... 257/99
    See application file for complete search history.

(56) References Cited

U.S. PATENT DOCUMENTS

| | | | |
|---|---|---|---|
| 10,374,027 B2 | 8/2019 | Choi | |
| 2011/0163331 A1* | 7/2011 | Yamazaki | H10K 50/14 257/E51.018 |
| 2012/0162053 A1* | 6/2012 | Lee | H10K 59/1315 345/80 |
| 2013/0069853 A1 | 3/2013 | Choi | |
| 2016/0079334 A1 | 3/2016 | Lee et al. | |
| 2016/0293888 A1 | 10/2016 | Shim et al. | |
| 2016/0315135 A1 | 10/2016 | Choi | |
| 2017/0005150 A1 | 1/2017 | Yeo et al. | |
| 2018/0083087 A1 | 3/2018 | Choi | |
| 2018/0097047 A1 | 4/2018 | Jung et al. | |
| 2018/0122882 A1 | 5/2018 | Lee et al. | |
| 2019/0165063 A1 | 5/2019 | Lee et al. | |
| 2020/0083311 A1 | 3/2020 | Cha et al. | |

FOREIGN PATENT DOCUMENTS

| | | |
|---|---|---|
| CN | 107785381 A | 3/2018 |
| KR | 10-2010-0100358 A | 9/2010 |
| KR | 10-2017-0003458 A | 1/2017 |
| KR | 10-2018-0013226 A | 2/2018 |
| KR | 10-2018-0060311 A | 6/2018 |

OTHER PUBLICATIONS

United States Office Action, U.S. Appl. No. 17/130,730, filed Nov. 28, 2022, 12 pages.
United States Office Action, U.S. Appl. No. 17/130,730, filed May 15, 2023, 11 pages.
Korean Intellectual Property Office, Office Action, Korean Patent Application No. 10-2019-0179737, Apr. 15, 2025, 18 pages.

* cited by examiner

DISPLAY DEVICE AND METHOD OF MANUFACTURING SAME

CROSS REFERENCE TO RELATED APPLICATION

The present application is a divisional of U.S. patent application Ser. No. 17/130,730 filed on Dec. 22, 2020, which claims priority to Republic of Korea Patent Application No. 10-2019-0179737, filed Dec. 31, 2019, each of which is incorporated by reference in its entirety.

BACKGROUND

Field of Technology

The present disclosure relates to a display device and a method of manufacturing the same.

Description of the Related Art

As information society has developed, various types of display devices have been developed. In recent years, various display devices, such as a liquid crystal display (LCD), a plasma display panel (PDP), and an organic light-emitting diode (OLED) display, have been used.

Organic light-emitting elements constituting an organic light-emitting diode display are self-luminous and do not require a separate light source, so that the thickness and the weight of the display device are reduced. In addition, the organic light-emitting diode display has high quality characteristics, such as low power consumption, high luminance, and a high response rate.

The organic light-emitting diode display may include multiple organic material layers formed over the entire area of the display panel. Such an organic material layer may form a penetration path of oxygen, moisture, and the like when a defect such as a crack occurs, and may thus degrade the life of the organic light-emitting diode display.

A display panel includes pixels including transistors, capacitors, and light-emitting elements. As the display device increases in resolution and size, a number of pixels are densely arranged in the display device. In order to secure the reliability of the display device, a method capable of reducing the complexity of the process and enhancing the yield is required.

The foregoing is intended merely to aid in the understanding of the background of the present disclosure, and is not intended to mean that the present disclosure falls within the purview of the related art that is already known to those skilled in the art.

SUMMARY

Various embodiments provide a display device and a method of manufacturing the same, in which a cathode electrode of a light-emitting element is in contact with a power line through a connection electrode formed in a source-drain layer.

Various embodiments provide a display device and a method of manufacturing the same, in which an end of a connection electrode connected to a source-drain layer is formed in a reverse-tapered shape and a cathode electrode of a light-emitting element is formed in such a manner as to wrap the end of the reverse-tapered connection electrode.

Various embodiments provide a display device and a method of manufacturing the same, in which in manufacturing a display panel through a solution process using inkjet equipment, a cathode electrode of a light-emitting element is in contact with a power line.

According to an embodiment, there is provided a display device including: a substrate including a pixel area and a non-pixel area adjacent to the pixel area; a power line formed on the substrate; at least one insulation layer covering the power line; a connection electrode formed on the at least one insulation layer, and connected to the power line through a contact hole; an overcoat layer covering the connection electrode in the pixel area; and a first electrode formed above the overcoat layer, wherein the connection electrode has at least an area formed in the non-pixel area, and the first electrode extends to the non-pixel area and is connected to the connection electrode.

The connection electrode may include a hole formed in the non-pixel area, and the first electrode may be formed in such a manner as to cover a part of an inner surface of the hole.

The inner surface of the hole may have a reverse-tapered shape.

The connection electrode may include multiple metal layers, and the hole may be formed in one or more layers including the topmost metal layer among the multiple metal layers.

The display device may further include: a second electrode formed between the overcoat layer and the first electrode in the pixel area; a bank covering an area of the second electrode; and an emission layer formed between the first electrode and the second electrode.

The emission layer may cover the second electrode and the bank, and may extend to the non-pixel area.

The emission layer may be formed within an area surrounded by the bank.

The display device may further include a first passivation film formed between the connection electrode and the overcoat layer.

The display device may further include a bather formed inside the hole, wherein at least a part of the bather is made of the same material as the first passivation film.

At least an area of the emission layer and the second electrode may be formed on the bather.

According to an embodiment, there is provided a method of manufacturing a display device, the method including: forming a power line on a substrate; forming at least one insulation layer covering the power line; forming a connection electrode that has at least an area placed in a non-pixel area of the substrate, and is connected to the power line through a contact hole; forming an overcoat layer in a pixel area disposed adjacent to the non-pixel area; and forming a first electrode extending from the pixel area to the non-pixel area, wherein the first electrode is connected to the connection electrode in the non-pixel area.

The method may further include, after the forming of the connection electrode, forming a hole in the connection electrode in the non-pixel area.

The forming of the connection electrode may include forming multiple metal layers, and the forming of the hole may be performed through a wet etch process using a selective etchant with which one or more layers among the multiple metal layers are etched.

After the forming of the overcoat layer, the method may further include: forming a second electrode in the pixel area; forming a bank covering an area of the second electrode; and forming an emission layer.

The emission layer may be formed in such a manner as to cover the second electrode and the bank, and extend to the non-pixel area.

The forming of the bank may include: applying, to an area in which the bank is to be formed, a solution that is a mixture of an organic insulation material and a hydrophobic material; and performing photolithography.

The forming of the emission layer may include: dropping an organic solution into an area surrounded by the bank; and hardening the organic solution.

The forming of the first electrode may be performed by using physics vapor deposition.

In the display device and the method of manufacturing the same according to the various embodiments, the structure of contact between the cathode electrode of the light-emitting element and the power line is simplified, and resistance between the connection electrode and the cathode electrode is reduced, whereby a driving power is stably supplied.

The various embodiments may reduce the complexity of the process of manufacturing the display device and may enhance the yield.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
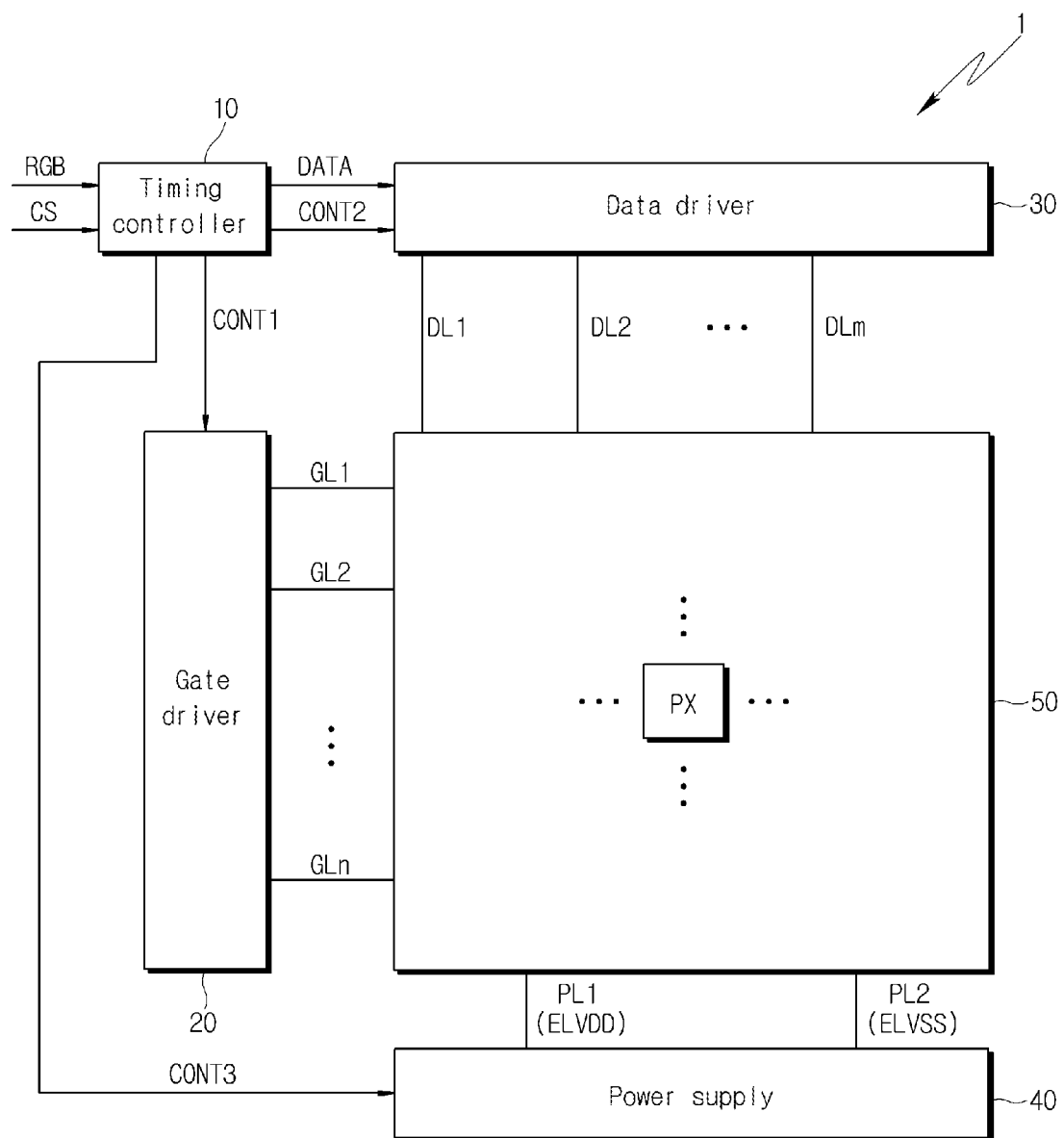
FIG. 1 is a block diagram showing a configuration of a display device according to an embodiment.

Hereinafter, various embodiments will be described with reference to the accompanying drawings. In the specification, when an element (area, layer, part, or the like) is referred to as being "on", "coupled to", or "combined with" another element, it may be directly on/coupled to/combined with the other element or an intervening element may be present therebetween.

The same reference numerals refer to same elements. In the drawings, the thicknesses, ratios, and sizes of the elements are exaggerated for effective description of the technical details. The term "and/or" includes one or more combinations that the associated elements may define.

Terms "first", "second", etc. can be used to describe various elements, but the elements are not to be construed as being limited to the terms. The terms are only used to differentiate one element from other elements. For example, the "first" element may be named the "second" element without departing from the scope of the various embodiments, and the "second" element may also be similarly named the "first" element. As used herein, the singular forms "a", "an", and "the" are intended to include the plural forms as well, unless the context clearly indicates otherwise.

The terms "under", "below", "on", "above", and the like are used herein for describing relationship between one or more elements shown in the drawings. These terms are relative concepts and are described on the basis of the direction in the drawings.

It is to be understood that terms such as "including", "having", etc. are intended to indicate the existence of the features, numbers, steps, actions, elements, components, or combinations thereof disclosed in the specification, and are not intended to preclude the possibility that one or more other features, numbers, steps, actions, elements, components, or combinations thereof may exist or may be added.

FIG. 1 is a block diagram showing a configuration of a display device according to an embodiment.

Referring to FIG. 1, a display device 1 includes a timing controller 10, a gate driver 20, a data driver 30, a power supply 40, and a display panel 50.

The timing controller 10 may receive an image signal RGB and a control signal CS from outside the display device 1. The image signal RGB may include multiple grayscale data. The control signal CS may include, for example, a horizontal synchronization signal, a vertical synchronization signal, and a main clock signal.

The timing controller 10 may process the image signal RGB and the control signal CS to make the signals appropriate for an operation condition of the display panel 50, so that the timing controller 10 may generate and output image data DATA, a gate driving control signal CONT1, a data driving control signal CONT2, and a power supply control signal CONT3.

The gate driver 20 may be connected to pixels PXs of the display panel 50 through multiple gate lines GL1 to GLn. The gate driver 20 may generate gate signals on the basis of the gate driving control signal CONT1 output from the timing controller 10. The gate driver 20 may provide the generated gate signals to the pixels PXs through the multiple gate lines GL1 to GLn.

The data driver 30 may be connected to the pixels PXs of the display panel 50 through multiple data lines DL1 to DLm. The data driver 30 may generate data signals on the basis of the image data DATA and the data driving control signal CONT2 output from the timing controller 10. The data driver 30 may provide the generated data signals to the pixels PXs through the multiple data lines DL1 to DLm.

The power supply 40 may be connected to the pixels PXs of the display panel 50 through multiple power lines PL1 and PL2. The power supply 40 may generate a driving voltage to be provided to the display panel 50, on the basis of the power supply control signal CONT3. The driving voltage may include, for example, a high-potential driving voltage ELVDD and a low-potential driving voltage ELVSS. The power supply 40 may provide the generated driving voltages ELVDD and ELVSS to the pixels PXs, through the corresponding power lines PL1 and PL2.

In the display panel 50, the multiple pixels PXs (or referred to as subpixels) are arranged. The pixels PXs may be, for example, arranged in a matrix form on the display panel 50.

Each of the pixels PXs may be electrically connected to the corresponding gate line and the corresponding data line. Such pixels PXs may emit light with luminance corresponding to the gate signals and the data signals that are supplied through the gate lines GL1 to GLn and the data lines DL1 to DLm, respectively.

Each pixel PX may display any one among a first to a third color. In an embodiment, each pixel PX may display any one among red, green, or blue color. In another embodiment, each pixel PX may display any one among cyan, magenta, or yellow color. In various embodiments, the pixels PXs may be configured to display any one among four or more colors. For example, each pixel PX may display any one among red, green, blue, or white color.

The timing controller 10, the gate driver 20, the data driver 30, and the power supply 40 may be configured as separate integrated circuits (ICs), or ICs in which at least some thereof are integrated. For example, at least one among the data driver 30 and the power supply 40 may be configured as an integrated circuit integrated with the timing controller 10.

In addition, in FIG. 1, the gate driver 20 and the data driver 30 are shown as elements separate from the display panel 50, but at least one among the gate driver 20 and the data driver 30 may be configured in an in-panel manner that is formed integrally with the display panel 50. For example, the gate driver 20 may be formed integrally with the display panel 50 according to a gate-in-panel (GIP) manner.

Figure 2:
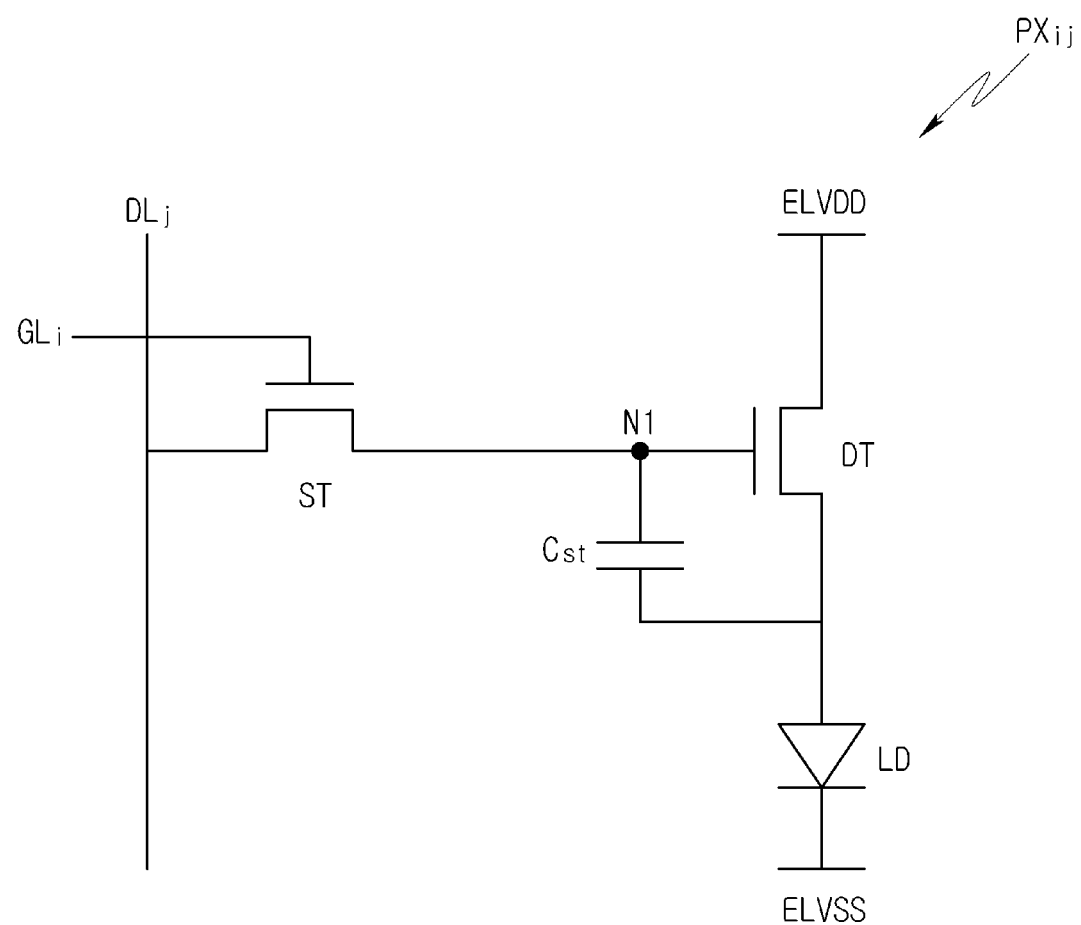
FIG. 2 is a circuit diagram showing an embodiment of a pixel shown in FIG. 1 according to an embodiment.

FIG. 2 is a circuit diagram showing an embodiment of the pixel shown in FIG. 1. FIG. 2 shows, as an example, a pixel PXij that is connected to an i-th gate line GLi and a j-th data line DLj.

Referring to FIG. 2, the pixel PX includes a switching transistor ST, a driving transistor DT, a storage capacitor Cst, and a light-emitting element LD.

A first electrode (for example, a source electrode) of the switching transistor ST is electrically connected to the j-th data line DLj, and a second electrode (for example, a drain electrode) of the switching transistor ST is electrically connected to a first node N1. A gate electrode of the switching transistor ST is electrically connected to the i-th gate line GLi. The switching transistor ST is turned on when a gate signal at a gate-on level is applied to through the i-th gate line GLi, and transmits a data signal applied through the j-th data line DLj, to the first node N1.

A first electrode of the storage capacitor Cst is electrically connected to the first node N1, and a second electrode of the storage capacitor Cst is connected to an anode electrode of the light-emitting element LD. The storage capacitor Cst may be charged with a voltage applied to the first node N1.

A first electrode (for example, a drain electrode) of the driving transistor DT receives the high-potential driving voltage ELVDD, and a second electrode (for example, a drain source electrode) of the driving transistor DT is electrically connected to a first electrode (for example, an anode electrode) of the light-emitting element LD. A gate electrode of the driving transistor DT is electrically connected to the first node N1. The driving transistor DT is turned on when a voltage at a gate-on level is applied through the first node N1, and may control the amount of a driving current flowing to the light-emitting element LD depending on a voltage applied to the gate electrode.

The light-emitting element LD outputs light corresponding to the driving current. The light-emitting element LD may output light corresponding to any one among red, green, or blue color. The light-emitting element LD may be an organic light-emitting diode (OLED) or an ultra-small inorganic light-emitting diode having a size in a micro to nanoscale range, but this embodiment is not limited thereto.

Hereinafter, an embodiment in which the light-emitting element LD is configured as an organic light-emitting diode (OLED) will be described.

In various embodiments, the structure of the pixels PXs is not limited to that shown in FIG. 2. According to an embodiment, the pixels PXs may further include at least one element for compensating for a threshold voltage of the driving transistor DT, or initializing a voltage of the gate electrode of the driving transistor DT and/or a voltage of the anode electrode of the light-emitting element LD.

FIG. 2 shows an example in which the switching transistor ST and the driving transistor DT are NMOS transistors, but this embodiment is not limited thereto. For example, at least some or all of the transistors constituting each pixel PX may be configured as a PMOS transistor. In various embodiments, each of the switching transistor ST and the driving transistor DT may be implemented as a low-temperature polycrystalline silicon (LTPS) thin-film transistor, an oxide thin-film transistor, or a low-temperature polycrystalline oxide (LTPO) thin-film transistor.

Figure 3:
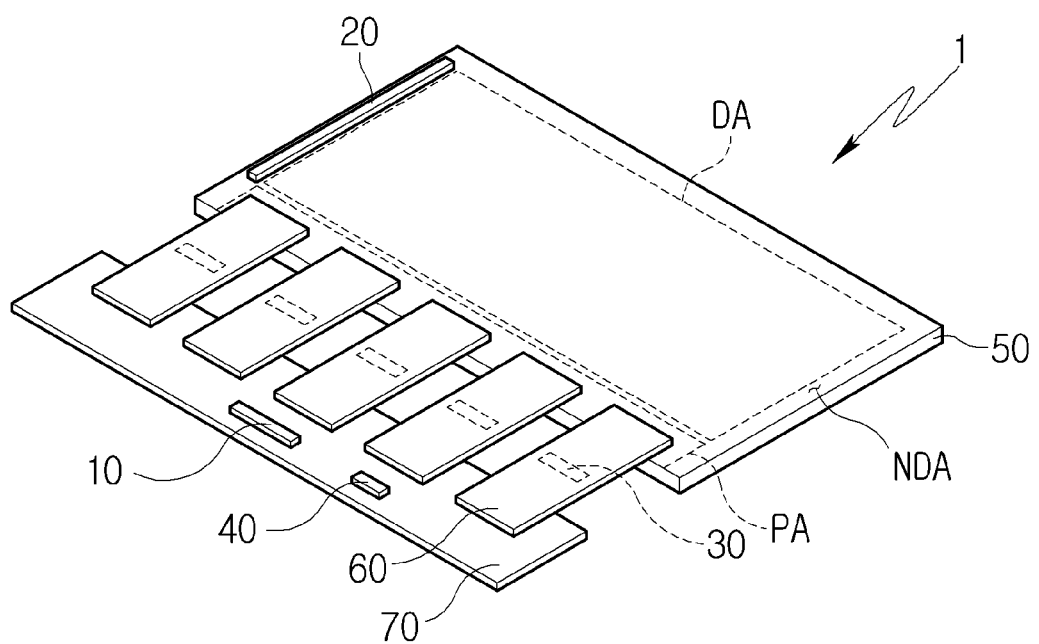
FIG. 3 is a perspective view according to an embodiment of the display device shown in FIG. 1.

FIG. 3 is a perspective view according to an embodiment of the display device shown in FIG. 1. With reference to FIG. 3 in connection with FIGS. 1 and 2, the elements of the display device 1 will be described in more detail.

The display device 1 may be implemented in various shapes. For example, the display device 1 may be implemented in the shape of a rectangular plate. However, this embodiment is not limited thereto. The display device 1 may be provided in various shapes, such as square, circular, elliptical, polygonal shapes, and the like. The display device 1 may have a shape in which a part of the edge is processed to be a curved surface or the thicknesses in at least one area vary. In addition, all or a part of the display device 1 may have flexibility.

The display panel 50 may include a display area DA and a non-display area NDA. The display area DA is an area in which the pixels PXs are arranged, and may be referred to as an active area. The non-display area NDA may be placed near the display area DA. For example, the non-display area NDA may be placed along the border of the display area DA. The non-display area NDA may comprehensively refer to an area excluding the display area DA on the display panel 50, and may be referred to as a non-active area.

In the non-display area NDA, as a driver for driving the pixels PXs, for example, the gate driver 20 may be provided. In the non-display area NDA, the gate driver 20 may be placed near one side or both sides of the display area DA. The gate driver 20 may be formed in the non-display area NDA of the display panel 50 in a gate-in-panel manner as shown in FIG. 3. However, in another embodiment, the gate driver 20 may be manufactured as a driver IC and may thus be mounted on a flexible film, or the like, and may be attached to the non-display area NDA in a tape-automated bonding (TAB) manner.

In the non-display area NDA, multiple pads (not shown) may be provided. The pads may not be covered by an insulation layer, but may be exposed to the outside of the display panel 50 and may be electrically connected to the data driver 30, a circuit board 70, and the like that will be described later.

The display panel 50 may include wires for supplying electrical signals to the pixels PXs. The wires may include, for example, the gate lines GL1 to GLn, the data lines DL1 to DLm, and the power lines PL1 and PL2.

The power lines PL1 and PL2 may be electrically connected to the power supply 40 (or the timing controller 10) through the connected pads, and may provide the high-potential driving power ELVDD and the low-potential driving power ELVSS provided from the power supply 40 (or the timing controller 10), to the pixels PXs.

A flexible film 60 is provided with a first end attached to a pad area PA of the display panel 50, and is provided with a second end attached to the circuit board 70, so that the display panel 50 and the circuit board 70 may be electrically connected. The flexible film 60 may include multiple wires for electrically connecting the pads formed in the pad area PA and wires of the circuit board 70. In an embodiment, the flexible film 60 may be attached on the pads through an anisotropic conducting film (ACF).

In the case where the data driver 30 is manufactured as a driver IC, the data driver 30 may be mounted on the flexible film 60 in a chip-on-film (COF) manner or a chip-on-plastic (COP) manner. The data driver 30 may generate data signals on the basis of the image data DATA and the data driving control signal CONT2 received from the timing controller 10, and may output the generated data signals to the data lines DL1 to DLm through the connected pads.

On the circuit board 70, a number of circuits implemented as driver ICs may be mounted. The circuit board 70 may be a printed circuit board or a flexible printed circuit board, but the type of the circuit board 70 is not limited thereto.

The circuit board 70 may include the timing controller 10 and the power supply 40 mounted in the form of an integrated circuit. FIG. 3 shows that the timing controller 10 and the power supply 40 are separate elements, but this embodiment is not limited thereto. That is, in various embodiments, the power supply 40 may be formed integrally with the timing controller 10, or the timing controller 10 may be configured to perform the function of the power supply 40.

Figure 4:
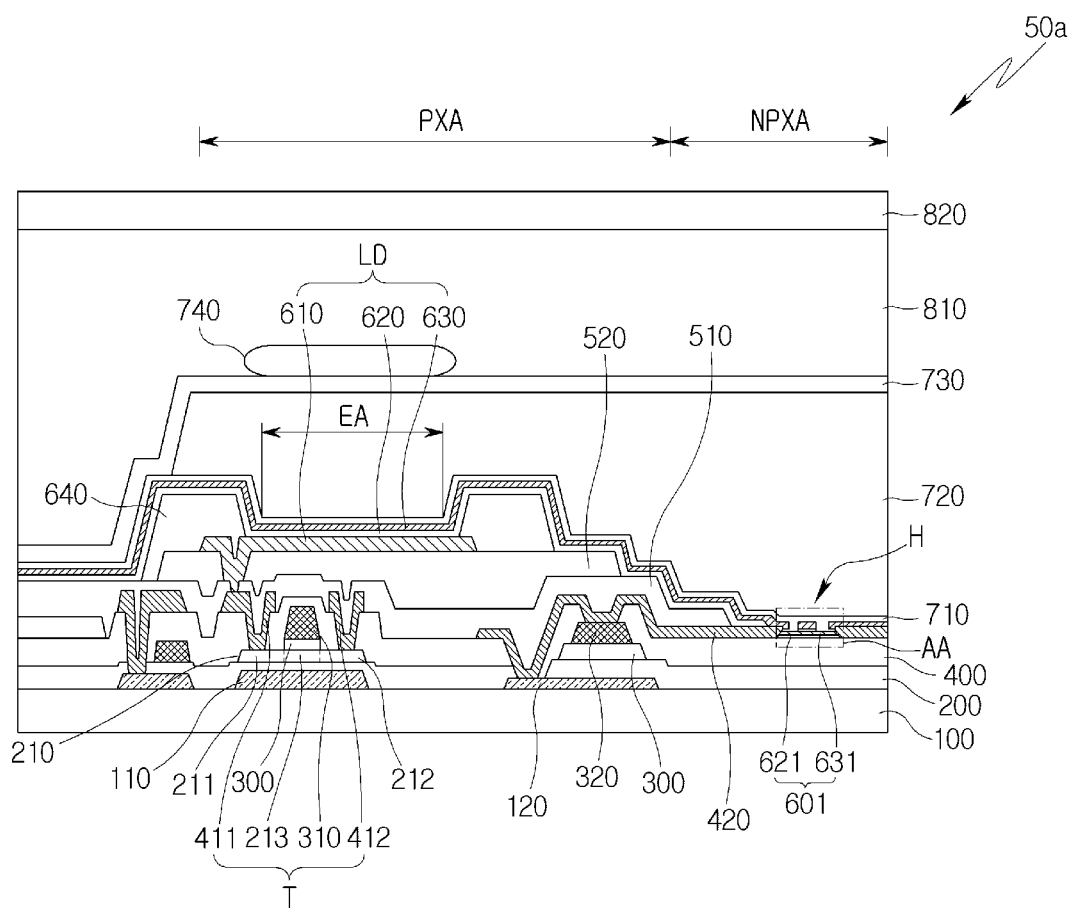
FIG. 4 is a cross-sectional view of a display panel according to an embodiment.
Figure 5:
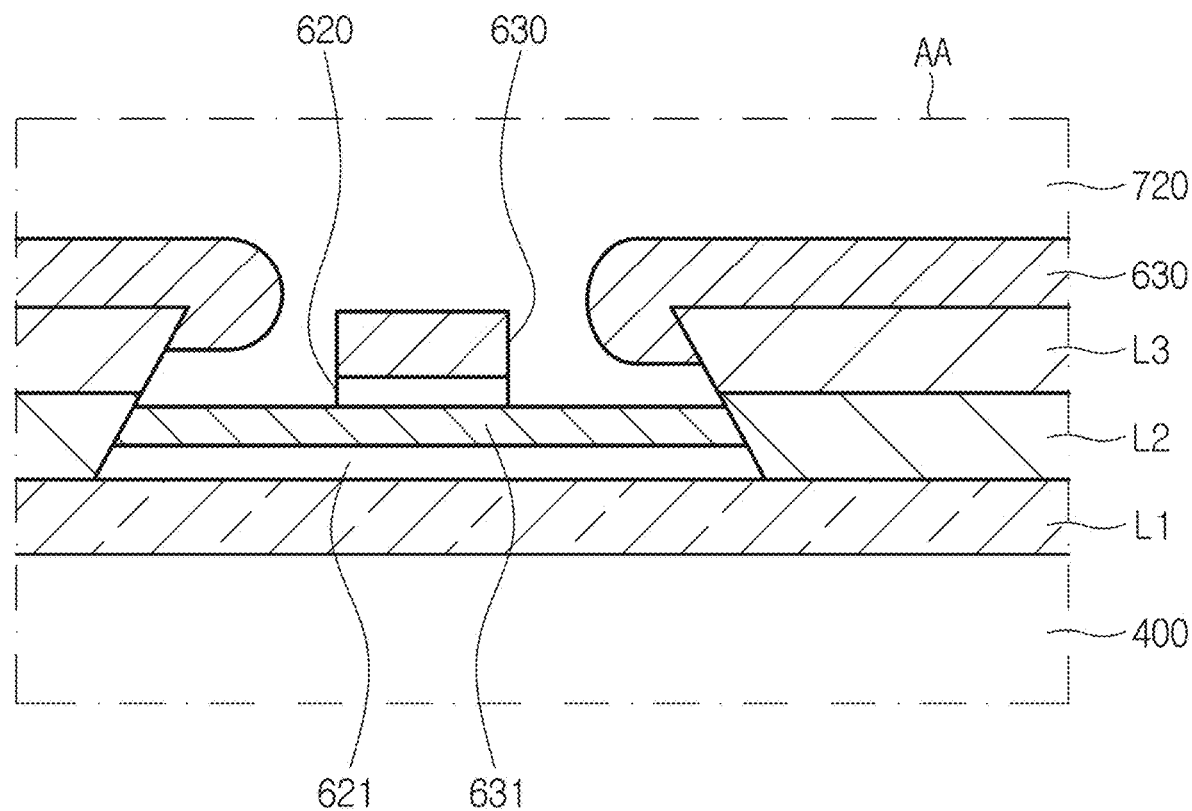
FIG. 5 is an enlarged cross-sectional view of area AA of FIG. 4 according to an embodiment.

FIG. 4 is a cross-sectional view of a display panel according to an embodiment. FIG. 5 is an enlarged cross-sectional view of area AA of FIG. 4. Hereinafter, various embodiments will be described with reference to FIG. 4 in connection with FIGS. 1 to 3.

Referring to FIG. 4, a display panel 50a may include a pixel area PXA, and a non-pixel area NPXA. In the pixel area PXA, circuit elements and a light-emitting element LD constituting a pixel PX are formed, and the non-pixel area NPXA is placed near the pixel area PXA. The non-pixel area NPXA may include a boundary between adjacent pixels PX, and/or a non-display area NDA.

The display panel 50a includes a substrate 100, a circuit element layer formed on the substrate 100, a light-emitting element layer, and a protective layer.

The substrate 100 is a base member of the display panel 50a, and may be a light-transmissive substrate. The substrate 100 may be a rigid substrate including glass or tempered glass, or may be a flexible substrate made of a plastic material. For example, the substrate 100 may be made of a plastic material, such as polyimide (PI), polyethylene terephthalate (PET), polyethylene naphthalate (PEN), polycarbonate (PC), and the like. However, the material of the substrate 100 is not limited thereto.

The circuit element layer may be formed on the substrate 100, and may include circuit elements (for example, a transistor T, a capacitor, and the like) and wires constituting the pixel PX.

On the substrate 100, a light blocking layer 110 and a second power line 120 through which the low-potential driving power ELVSS is applied are placed. When viewed from above, the light blocking layer 110 is placed in such a manner as to be overlapped by an active pattern 210 of the transistor T, particularly, a channel 213, and may thus protect the oxide semiconductor device from external light.

In the following embodiments, it is described that the second power line 120 is placed on the substrate 100, but this embodiment is not limited thereto. That is, in various embodiments, the second power line 120 may be replaced with any electrode layer for applying any signal or power to the pixel PX.

A buffer layer 200 is placed on the substrate 100 to cover the light blocking layer 110 and the second power line 120. The buffer layer 200 may reduce diffusion of ions or impurities from the substrate 100, and may reduce moisture penetration. In addition, the buffer layer 200 may enhance the flatness of the surface of the substrate 100. The buffer layer 200 may include an inorganic material, such as an oxide, a nitride, and the like, an organic material, or an organic-inorganic compound. The buffer layer 200 may be formed in a single-layer or multi-layer structure. For example, the buffer layer 200 may have a structure of three or more layers of silicon oxide and silicon nitride.

On the buffer layer 200, an active pattern 210 may be formed. The active pattern 210 may be made of a silicon-based semiconductor material or an oxide-based semiconductor material. As the silicon-based semiconductor material, amorphous silicon or polycrystalline silicon may be used. As the oxide-based semiconductor material, a quaternary metal oxide, such as an indium tin gallium zinc oxide (InSnGaZnO), a ternary metal oxide, such as an indium gallium zinc oxide (InGaZnO), an indium tin zinc oxide (InSnZnO), an indium aluminum zinc oxide (InAlZnO), a tin gallium zinc oxide (SnGaZnO), an aluminum gallium zinc oxide (AlGaZnO), a tin aluminum zinc oxide (SnAlZnO), or a binary metal oxide, such as an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), an indium gallium oxide (InGaO), an indium oxide (InO), a tin oxide (SnO), a zinc oxide (ZnO), may be used.

The active pattern 210 may include: a source region 212 and a drain region 211 containing p-type or n-type impurities; and a channel 213 formed between the source region 212 and the drain region 211.

A gate insulation layer 300 may be placed corresponding to areas in which a gate electrode 310 and a first connection electrode 320 are formed, respectively, which will be described later. For example, the gate insulation layer 300 may be formed on the channel 213 of the active pattern 210. In addition, the gate insulation layer 300 may be formed on the buffer layer 200 in such a manner as to be adjacent to the second power line 120 or have at least an area overlapping the same. The gate insulation layer 300 may be a silicon oxide (SiOx), a silicon nitride (SiNx), or multiple layers of a silicon oxide (SiOx) and a silicon nitride (SiNx).

On the gate insulation layer 300, a first conductive layer may be placed. The first conductive layer may be a first gate layer.

The first conductive layer may include the gate electrode 310. The gate electrode 310 may be placed at a position corresponding to the channel 213 of the active pattern 210. The gate electrode 310 may be made of any one or an alloy selected from a group consisting of molybdenum (Mo), aluminum (Al), chromium (Cr), gold (Au), titanium (Ti), nickel (Ni), neodymium (Nd), and copper (Cu). In addition, the gate electrode 310 may be multiple layers composed of any one or an alloy selected from a group consisting of molybdenum (Mo), aluminum (Al), chromium (Cr), gold (Au), titanium (Ti), nickel (Ni), neodymium (Nd), and copper (Cu). For example, the gate electrode 310 may be a double layer of molybdenum and aluminum-neodymium, or molybdenum and aluminum.

The first conductive layer may further include the first connection electrode 320. The first connection electrode 320 may be placed in such a manner as to be adjacent to the second power line 120 or have at least an area overlapping the same. The first connection electrode 320 may be composed of the same material as the gate electrode 310, and may be formed through the same process as the gate electrode 310. However, the present disclosure is not limited thereto.

The first conductive layer may further include electrodes of the circuit element, and driving lines, for example, a lower electrode of the storage capacitor Cst, the gate lines GL1 to GLn, and the like.

On the first conductive layer, an interlayer insulation layer 400 may be formed. The interlayer insulation layer 400 covers the gate electrode 310 and the first connection electrode 320 constituting the first conductive layer. The interlayer insulation layer 400 may be a silicon oxide film (SiOx), a silicon nitride film (SiNx), or multiple layers of a silicon oxide film (SiOx) and a silicon nitride film (SiNx).

In various embodiments, the interlayer insulation layer 400 may be configured in multiple layers, and conductive layers may be further formed between the multiple layers of the interlayer insulation layers 400. The conductive layers formed between the interlayer insulation layers 400 may further include electrodes of the circuit element, and driving lines, for example, an auxiliary gate electrode of the transistor T, an upper electrode of the storage capacitor Cst, and the like.

On the interlayer insulation layer 400, a second conductive layer may be formed. The second conductive layer may be a source-drain layer.

The second conductive layer may include a source electrode 412 and a drain electrode 411. The source electrode 412 and the drain electrode 411 may be placed on the interlayer insulation layer 400, being spaced apart from each other by a predetermined distance. The source electrode 412 and the drain electrode 411 may be connected to the source region 212 and the drain region 211 of the active pattern 210 through contact holes penetrating through the interlayer insulation layer 400, respectively.

The source electrode 412 and the drain electrode 411 may be formed as a single layer or multiple layers composed of any one or an alloy selected from a group consisting of molybdenum (Mo), aluminum (Al), chromium (Cr), gold (Au), titanium (Ti), nickel (Ni), neodymium (Nd), and copper (Cu). When the source electrode 412 and the drain electrode 411 are multiple layers, they may be composed of a double layer of molybdenum and aluminum-neodymium, or a triple layer of titanium and aluminum and titanium; molybdenum and aluminum and molybdenum; or molybdenum and aluminum-neodymium and molybdenum.

The source electrode 412, the drain electrode 411, the gate electrode 310, and the active pattern 210 corresponding thereto may constitute the transistor T. The transistor T may be, for example, the driving transistor DT or the switching transistor ST. FIG. 4 shows, as an example, the driving transistor DT of which the drain electrode 411 is connected to a first electrode 610 of the light-emitting element LD.

The second conductive layer may further include a second connection electrode 420. The second connection electrode 420 is connected to the second power line 120 through a contact hole penetrating through the interlayer insulation layer 400 and the buffer layer 200. Although not shown, the second connection electrode 420 may be further connected to the first connection electrode 320 through a contact hole penetrating through the interlayer insulation layer 400. The second connection electrode 420 may be composed of the same material as the source electrode 412 and the drain electrode 411, and may be formed as a single layer or multiple layers.

In various embodiments, the second conductive layer may further include various driving lines, for example, the data lines DL1 to DLm, and the power lines (for example, a first power line PL1).

On the second conductive layer, a first passivation film 510 may be formed. The first passivation film 510 may be an insulation film for protecting the lower elements, and may be a silicon oxide film (SiOx), a silicon nitride film (SiNx), or multiple layers of a silicon oxide film (SiOx) and a silicon nitride film (SiNx).

On the first passivation film 510, an overcoat layer 520 may be formed. The overcoat layer 520 may be a planarizing film for reducing the step difference in the lower structure, and may be composed of an organic material such as polyimide, benzocyclobutene series resin, acrylate, and the like.

In various embodiments, any one among the first passivation film 510 and the overcoat layer 520 may be omitted.

The light-emitting element layer is formed on the overcoat layer 520, and includes light-emitting elements LDs. The light-emitting element LD includes the first electrode 610, an emission layer 620, and a second electrode 630. The first electrode 610 may be an anode electrode, and the second electrode 630 may be a cathode electrode.

At least one among the first electrode 610 and the second electrode 630 may be a transmissive electrode and at least another may be a reflective electrode. For example, in the case where the light-emitting element LD is a bottom emission type, the first electrode 610 may be a transmissive electrode, and the second electrode 630 may be a reflective electrode. In contrast, in the case where the light-emitting element LD is a top emission type, the first electrode 610 may be a reflective electrode, and the second electrode 630 may be a transmissive electrode. In another example, in the case where the light-emitting element LD is a dual emission type, both the first electrode 610 and the second electrode 630 may be transmissive electrodes. Hereinafter, taking the case where the light-emitting element LD is a top emission type as an example, a detailed configuration of the light-emitting element LD will be described.

The first electrode 610 is formed on the overcoat layer 520. The first electrode 610 is connected to the drain electrode 411 of the transistor T through a via hole penetrating through the overcoat layer 520 and the first passivation film 510. The first electrode 610 may be composed of a transparent conductive material, such as indium tin oxide (ITO), indium zinc oxide (IZO), zinc oxide (ZnO), or the like. In the case where the first electrode 610 is a reflective electrode, the first electrode 610 may include a reflective layer. The reflective layer may be made of aluminum (Al), copper (Cu), silver (Ag), nickel (Ni), or an alloy thereof. In an embodiment, the reflective layer may be composed of an alloy (APC) of silver, palladium, and copper.

A bank 640 may be formed on the overcoat layer 520. The bank 640 may be a pixel definition film defining an emission area EA of a pixel PX. The bank 640 may be formed in such a manner that a partial area, for example, a central portion of the first electrode 610 is exposed, but the remaining area, for example, the edge of the first electrode 610, is covered.

In one embodiment, the exposed area of the first electrode 610 is designed to have as maximum area as possible in order to ensure a sufficient aperture ratio. The exposed area of the first electrode 610 which is not covered by the bank 640 may be defined as the emission area EA of the pixel PX. In the emission area EA, the first electrode 610, the emission layer 620, and the second electrode 630 are stacked in such a manner as to be directly in contact with each other. The bank 640 may be made of an organic film such as an acrylic resin, an epoxy resin, a phenolic resin, a polyamide resin, a polyimide resin, and the like.

On the first electrode 610 and the bank 640, the emission layer 620 is formed. The emission layer 620 may have a multi-layer thin-film structure including a light generation layer. For example, the emission layer 620 may include a hole transport layer (HTL), an organic emission layer, and an electron transport layer (ETL). The hole transport layer smoothly transports holes injected from the first electrode 610, to the organic emission layer. The organic emission layer may be made of an organic material including a phosphorescent or fluorescent material. The electron transport layer smoothly transports electrons injected from the second electrode 630, to the organic emission layer. In addition to the hole transport layer, the organic emission layer, and the electron transport layer, the emission layer 620 may further include a hole injection layer (HIL), a hole blocking layer (HBL), an electron injection layer (EIL), and an electron blocking layer (EBL).

The emission layer 620 may be formed in a tandem structure of two or more stacks. In this case, each of the stacks may include the hole transport layer, the organic emission layer, and the electron transport layer. In the case where the emission layer 620 is formed in the tandem structure of two or more stacks, a charge generation layer is formed between the stacks. The charge generation layer may include an n-type charge generation layer and a p-type charge generation layer. The n-type charge generation layer is positioned near the lower stack. The p-type charge generation layer is formed on the n-type charge generation layer and is thus positioned near the upper stack. The n-type charge generation layer injects electrons into the lower stack, and the p-type charge generation layer injects holes into the upper stack. The n-type charge generation layer may be an organic layer obtained by doping, into an organic host material having electron transport capability, alkali metals, such as lithium (Li), sodium (Na), potassium (K), or cesium (Cs), or alkaline earth metals, such as magnesium (Mg), strontium (Sr), barium (Ba), or radium (Ra). The p-type charge generation layer may be an organic layer obtained by doping dopants into an organic host material having hole transport capability.

The color of light generated by the light generation layer may be one among red, green, o blue, but the present disclosure is not limited thereto. For example, the color of light generated by the light generation layer of the emission layer 620 may be one among magenta, cyan, or yellow color, or may be white.

The second electrode 630 is formed on the emission layer 620. The second electrode 630 may be formed in such a manner as to cover the emission layer 620. The second electrode 630 may be made of a transparent conductive material (TCO) capable of transmitting light, or a semi-transmissive conductive material, such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In the case where the second electrode 630 is made of the semi-transmissive conductive material, light emission efficiency may be increased due to a micro cavity.

The protective layer may be formed on the second electrode 630. The protective layer reduces penetration of oxygen or moisture into the light-emitting element LD. The protective layer may be formed in a multi-layer structure including at least one inorganic film and at least one organic film. For example, the protective layer may include a second passivation film 710, a first cover layer 720, and a third passivation film 730 stacked in order.

The second passivation film 710 is an inorganic film, and may be made of at least one among a silicon nitride, an aluminum nitride, a zirconium nitride, a titanium nitride, a hafnium nitride, a tantalum nitride, a silicon oxide, an aluminum oxide, or a titanium oxide.

The second passivation film 710 may be formed widely within a display area DA of the substrate 100.

The first cover layer 720 is an organic film, and serves as a foreign-matter cover layer (also referred to as a particle cover layer). The first cover layer 720 may be formed to have a sufficient thickness so as to reduce foreign matters (particles) from penetrating into the emission layer 620 and the second electrode 630. The first cover layer 720 may be made of a transparent material in order to transmit light emitted from the emission layer 620. The first cover layer 720 may be made of an organic material capable of transmitting 99% or more of light emitted from the emission layer 620, for example, an acrylic resin, an epoxy resin, a phenolic resin, a polyamide resin, a benzocyclobutene resin, or a polyimide resin, but is not limited thereto.

The third passivation film 730 is an inorganic film, and may be made of the same maternal as the second passivation film 710. For example, the third passivation film 730 may be made of at least one among a silicon nitride, an aluminum nitride, a zirconium nitride, a titanium nitride, a hafnium nitride, a tantalum nitride, a silicon oxide, an aluminum oxide, or a titanium oxide.

In various embodiments, on the protective layer, a color filter 740 may be further formed. In an embodiment, the color filter 740 may be placed between blocks matrices not shown. The color filter 740 may be placed in an area corresponding to the emission area EA. In the case where the emission layer 620 emits light in red, green, or blue color, the color filter 740 may be omitted.

On the color filter 740, a second cover layer 810 may be formed. The second cover layer 810 may be a planarizing film for reducing the step difference in the lower structure. In addition, the second cover layer 810 may serve as a foreign-matter cover layer. The second cover layer 810 may be made of a transparent material in order to transmit light passed through the color filter 740.

On the second cover layer 810, an upper substrate 820 may be formed. The upper substrate 820 may be bonded above the substrate 100 by using an adhesive, or the like, but the bonding method of the upper substrate 820 is not limited thereto.

Hereinafter, in various embodiments, a method of electrically connecting the second electrode 630 of the light-emitting element LD and the second power line 120 through the second connection electrode 420 formed in the source-drain layer will be described in detail.

The overcoat layer 520 and the bank 640 are not formed in the non-pixel area NPXA. Accordingly, in the non-pixel area NPXA, the first passivation film 510 may be exposed upward.

The second electrode 630 of the light-emitting element LD extends to the non-pixel area NPXA and is connected to the exposed second connection electrode 420. Since the second connection electrode 420 is connected to the second power line 120 through the contact hole, the second electrode 630 is connected to the second power line 120, passing through the second connection electrode 420. The low-potential driving voltage ELVSS supplied through the second power line 120 may be supplied to the second electrode 630 of the light-emitting element LD through the second connection electrode 420.

In another embodiment, in addition to the second connection electrode 420, an auxiliary electrode formed in the same layer as the first electrode 610 may be used in order to connect the second power line 120 and the second electrode 630. Compared with such another embodiment, in the present embodiment, the second power line 120 and the second electrode 630 are connected to each other without using the auxiliary electrode. Therefore, the resistance between the second power line 120 and the second electrode 630 may be reduced, and the low-potential driving voltage ELVSS supplied through the second power line 120 may be more stably supplied to the second electrode 630.

The second connection electrode 420 is provided with a hole H formed therein. The hole H is provided to physically divide both the emission layer 620 and the second electrode 630 formed afterward, between adjacent pixel areas PXAs, and a structure in which the second electrode 630 is directly connected to the second connection electrode 420 is provided.

Specifically, referring to FIG. 5, the hole H may be formed in such a manner as to be gradually widen in width, starting from the upper surface to the lower surface of the second connection electrode 420. That is, the hole H may have its edge in a reverse-tapered shape.

In an embodiment, the emission layer 620 may be formed using evaporation deposition. In addition, the second electrode 630 may be formed by using physics vapor deposition, such as sputtering. The materials constituting the emission layer 620 and the second electrode 630 have poor step coverage characteristics. Therefore, when these materials are deposited, the materials may be connected rather than divided at the opposite ends of the hole H provided with the step difference. If both the emission layer 620 and the second electrode 630 are not properly divided between adjacent pixel areas PXAs, the pixels PXs arranged in each of the pixel areas PXAs are unable to emit light in correct colors and deterioration in image quality may occur.

As shown in FIG. 5, when the hole H is formed in a reverse-tapered shape, both the emission layer 620 and the second electrode 630 are physically completely divided by the hole H.

Connection of the second electrode 630 and the second connection electrode 420 may be implemented by a difference in step coverage characteristics between the material of the emission layer 620 and the material of the second electrode 630. That is, the material of the emission layer 620 has a poor step coverage characteristic, and is thus formed discontinuously at the edge of the hole H. However, the material of the second electrode 630 has a better step coverage characteristic than the material of the emission layer 620, and thus covers a part of the inner surface of the hole H. Accordingly, the second electrode 630 may be directly in contact with the second connection electrode 420.

The second passivation film 710 formed afterward has an excellent step coverage characteristic, and is thus not divided into two at the hole H. Accordingly, the second passivation film 710 may be formed filling the hole H. The second passivation film 710 covers the second connection electrode 420 and the second electrode 630 and reduces external contaminants, such as oxygen, moisture, or the like, from penetrating. In addition, the second passivation film 710 blocks a lateral penetration path of contaminants between the divided layers at the opposite ends of the hole H, so that the diffusion of contamination between adjacent pixels PXs is prevented.

In various embodiments, in the case where the second connection electrode 420 has multiple layers, the hole H may be formed in at least one layer. For example, as shown in FIG. 5, the second connection electrode 420 may include a first to a third metal layer L1, L2, and L3. The first metal layer L1 may be made of a material having a high adhesion characteristic to the surface of the interlayer insulation layer 400. The second metal layer L2 may be made of a metal having low resistance. The third metal layer L3 may be made of a material having a strong corrosion resistance. For example, the first metal layer L1 and the third metal layer L3 may be made of an alloy (MoTi) of molybdenum and titanium, and the second metal layer L2 may be made of copper. However, the materials constituting the second connection electrode 420 are not limited thereto.

The hole H may be formed in at least one among the first to the third metal layer L1, L2, and L3 of the second connection electrode 420. For example, as shown in FIG. 5, the hole H may be formed in the second and the third metal layer L2 and L3. In the case where the edge of the hole H has a reverse-tapered shape, the width of the hole H in the third metal layer L3 may be formed in such a manner as to be narrower than the width of the hole H in the second metal layer L2. In this embodiment, in the area where the hole H is formed, the surface of the first metal layer L1 may be exposed.

The hole H may be formed through a wet etching process. For example, the hole H may be formed by using a selective etchant with which the second and the third metal layer L2 and L3 are etched but the first metal layer L1 is not etched. Herein, the reverse-tapered shape may be formed in the second and the third metal layer L2 and L3 due to the difference in etch rates between the second metal layer L2 and the third metal layer L3.

On the first metal layer L1 exposed due to the hole H, a bather 601 may be formed. The bather 601 may be formed together in a manufacturing process of the upper layers of the second connection electrode 420. For example, the bather 601 may include a first layer 621 and a second layer 631. The first layer 621 may be made of the same material as the first passivation film 510 and may be formed through the same process as the same. The second layer 631 may be made of the same material as the first electrode 610 and may be formed through the same process as the same. However, the materials constituting the barrier 601 are not limited thereto. The barrier 601 may be formed through a separate process from the upper layers. By the bather 601, a lateral penetration path of contaminants between the divided layers at the opposite ends of the hole H may be more effectively prevented. On the bather 601, a part of the emission layer 620 and a part of the second electrode 630 deposited after forming the barrier 601 may be formed.

FIGS. 6 to 12 are diagrams showing a method of manufacturing the display panel shown in FIG. 4.

Figure 6:
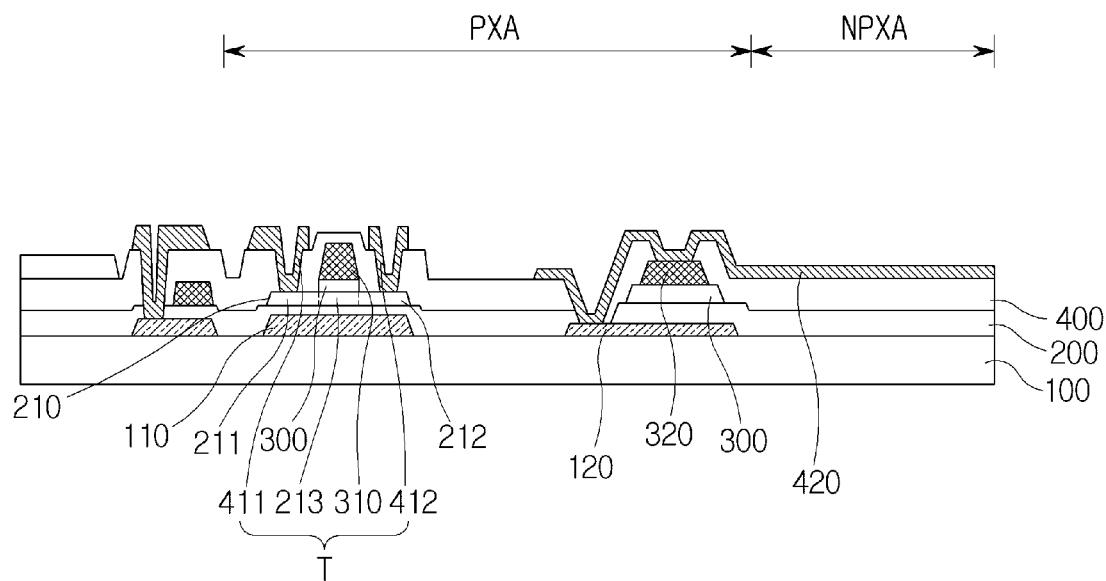
FIGS. 6 to 12 are diagrams showing a method of manufacturing the display panel shown in FIG. 4 according to an embodiment.

Referring to FIG. 6, on the substrate 100, the light blocking layer 110 and the second power line 120 are formed, and the buffer layer 200 is formed thereon. On the buffer layer 200, the active pattern 210 is formed. P-type or n-type impurities are doped into the active pattern 210, so that the source region 212 and the drain region 211 are formed. The channel 213 may be formed between the source region 212 and the drain region 211.

On the active pattern 210, the gate insulation layer 300 may be formed. The gate insulation layer 300 may be formed at positions connected to the gate electrode 310 and the first connection electrode 320, respectively. On the gate insulation layers 300, the gate electrode 310 and the first connection electrode 320 are formed. Afterward, the interlayer insulation layer 400 is formed. The interlayer insulation layer 400 may cover the gate electrode 310 and the first connection electrode 320.

On the interlayer insulation layer 400, the source electrode 412 and the drain electrode 411 may be formed. The source electrode 412 and the drain electrode 411 may be connected to the source region 212 and the drain region 211 of the active pattern 210 through the contact holes penetrating through the interlayer insulation layer 400, respectively.

On the interlayer insulation layer 400, the second connection electrode 420 may be further formed. The second connection electrode 420 is connected to the second power line 120 through the contact hole penetrating through the interlayer insulation layer 400 and the buffer layer 200. Although not shown, the second connection electrode 420 may be further connected to the first connection electrode 320 through the contact hole penetrating through the interlayer insulation layer 400.

Figure 7:
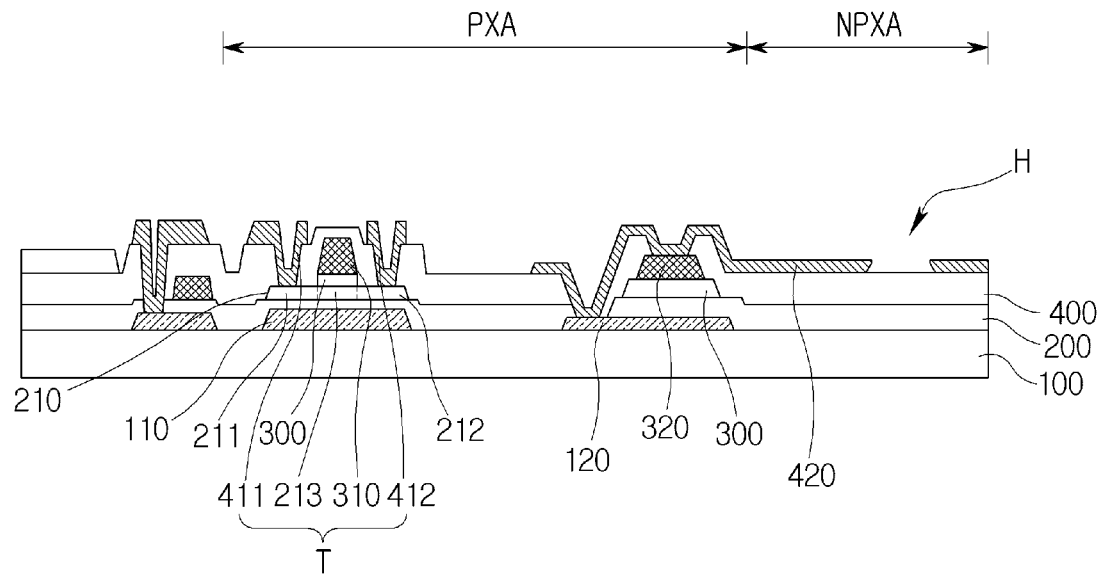

Referring to FIG. 7, the second connection electrode 420 may be provided with a hole H formed therein. The hole H may be formed in such a manner as to be in a reverse-tapered shape through a wet etching process. For example, in order to make the size of the hole H at the lower position bigger than that at the upper position, the hole H may be formed in multiple layers through wet etching processes to which different etch rates are applied. However, the method of forming the hole H is not limited thereto.

Figure 8:
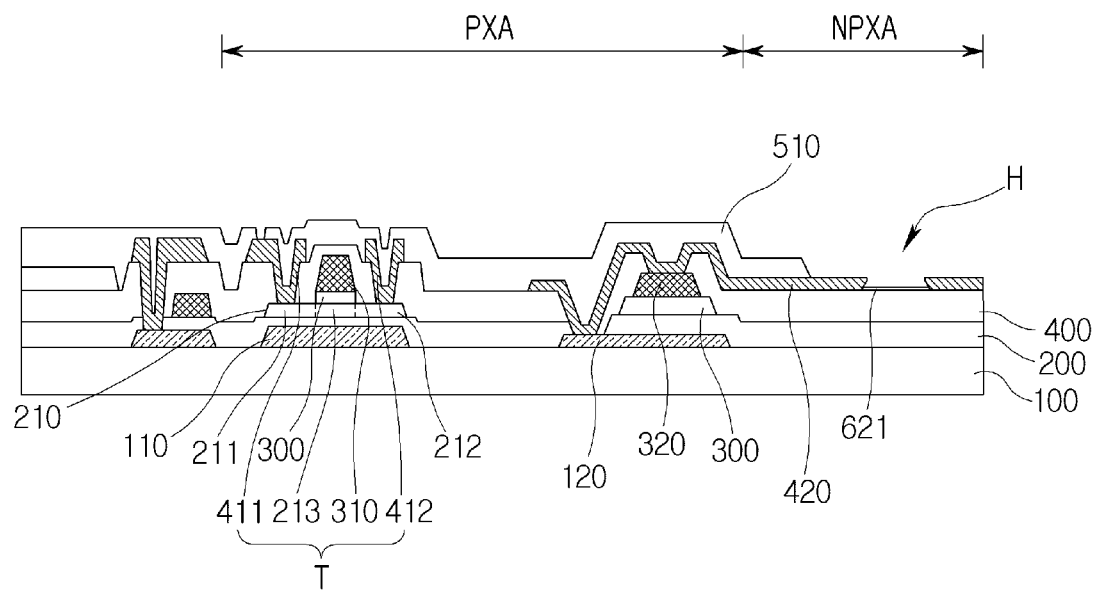

Referring to FIG. 8, the first passivation film 510 may be formed. The first passivation film 510 may cover the source electrode 412, the drain electrode 411, and the second connection electrode 420. When the first passivation film 510 is formed, a part of the material of the first passivation film 510 is deposited inside the hole H and the first layer 621 of the bather 601 is formed.

Figure 9:
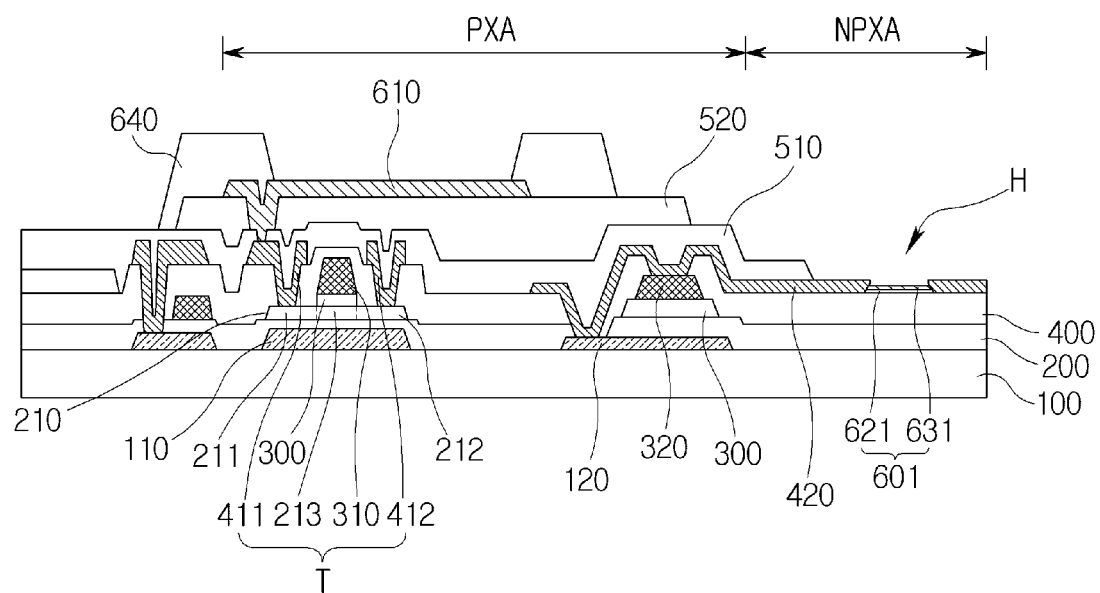

Referring to FIG. 9, on the first passivation film 510, the overcoat layer 520 is formed. The overcoat layer 520 may be formed in a pattern in such a manner as to be formed in the pixel area PXA. This overcoat layer 520 does not cover the hole H.

On the overcoat layer 520, the first electrode 610 is formed. The first electrode 610 is connected to the drain electrode 411 through the via hole penetrating through the overcoat layer 520 and the first passivation film 510. When the first electrode 610 is formed, a part of the material of the first electrode 610 is deposited inside the hole H and the second layer 631 of the barrier 601 is formed.

Afterward, the bank 640 is formed. The bank 640 may be formed to cover the edge of the first electrode 610 and the overcoat layer 520. The bank 640 may be formed in a pattern in such a manner as to be formed in the pixel area PXA. This bank 640 does not cover the hole H.

Figure 10:
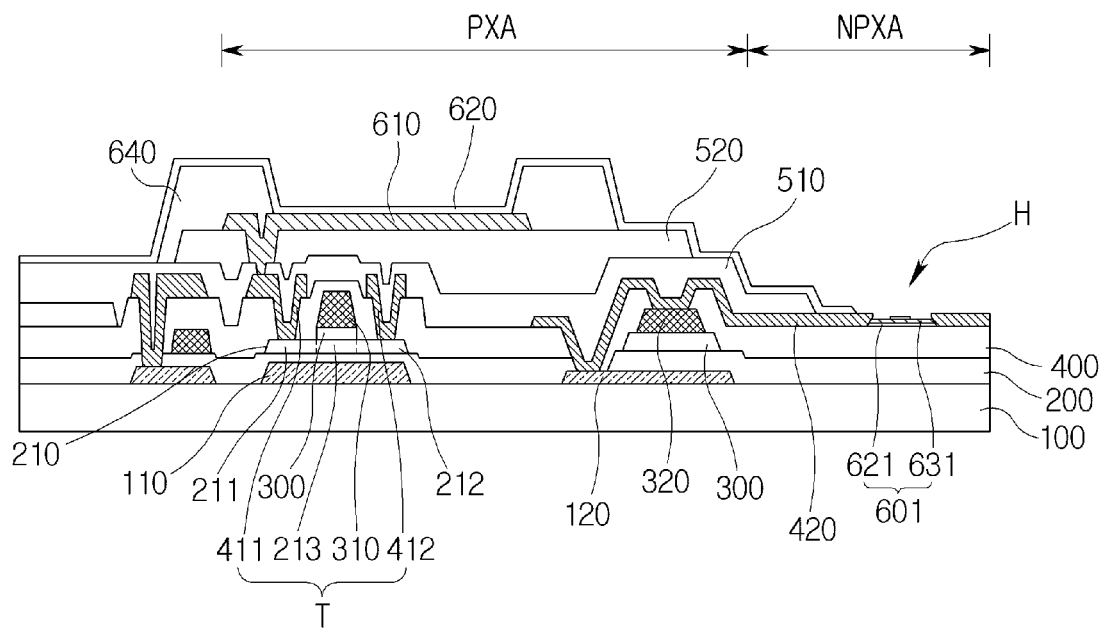

Referring to FIG. 10, on the first electrode 610 and the bank 640, the emission layer 620 is formed. The emission layer 620 may be formed using evaporation deposition. The emission layer 620 is physically divided by the hole H and is formed in a discontinuous shape. Herein, the emission layer 620 may be deposited on the exposed surface inside the hole H.

Figure 11:
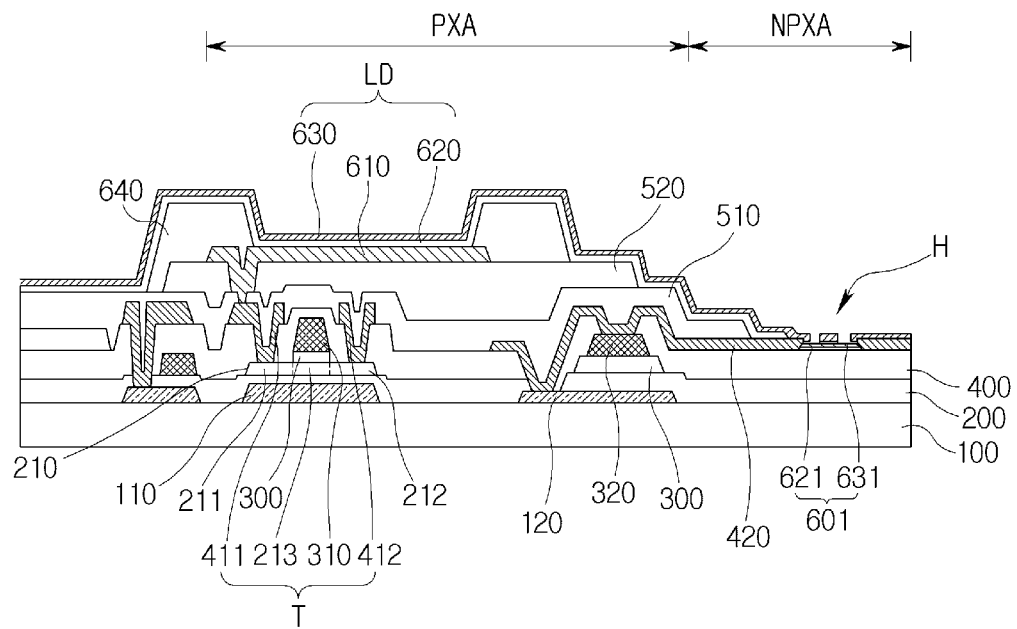

Referring to FIG. 11, on the emission layer 620, the second electrode 630 is formed. The second electrode 630 may be formed by using physics vapor deposition, such as sputtering. The second electrode 630 is physically divided by the hole H and is formed in a discontinuous shape. Due to the relatively good step coverage characteristic of the second electrode 630, the second electrode 630 is formed covering a part of the inner surface of the hole H. Accordingly, the second electrode 630 may be connected to the second connection electrode 420. On the exposed surface inside the hole H, the second electrode 630 may be deposited.

Figure 12:
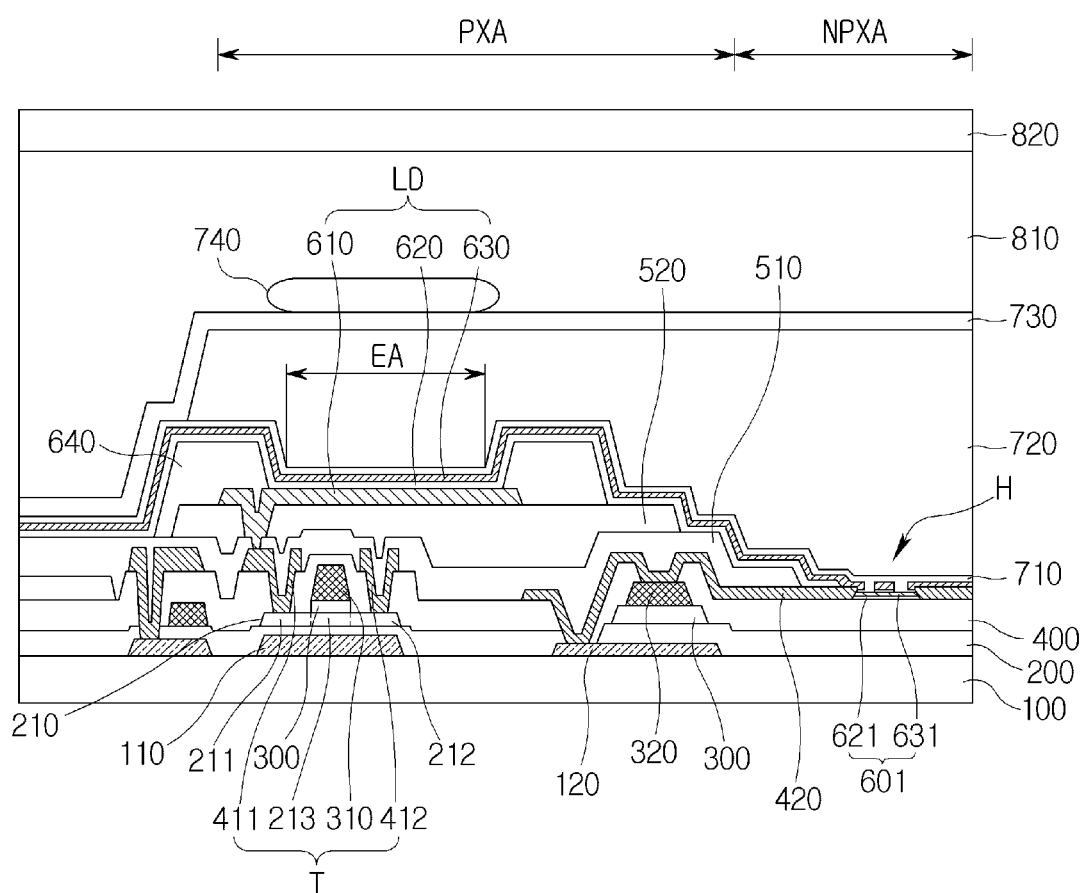

Referring to FIG. 12, the second passivation film 710, the first cover layer 720, and the third passivation film 730 may be formed in order. On the third passivation film 730, the color filter 740 may be further formed. On the color filter 740, the second cover layer 810 is further formed, and the upper substrate 820 is bonded through an adhesive, or the like.

Figure 13:
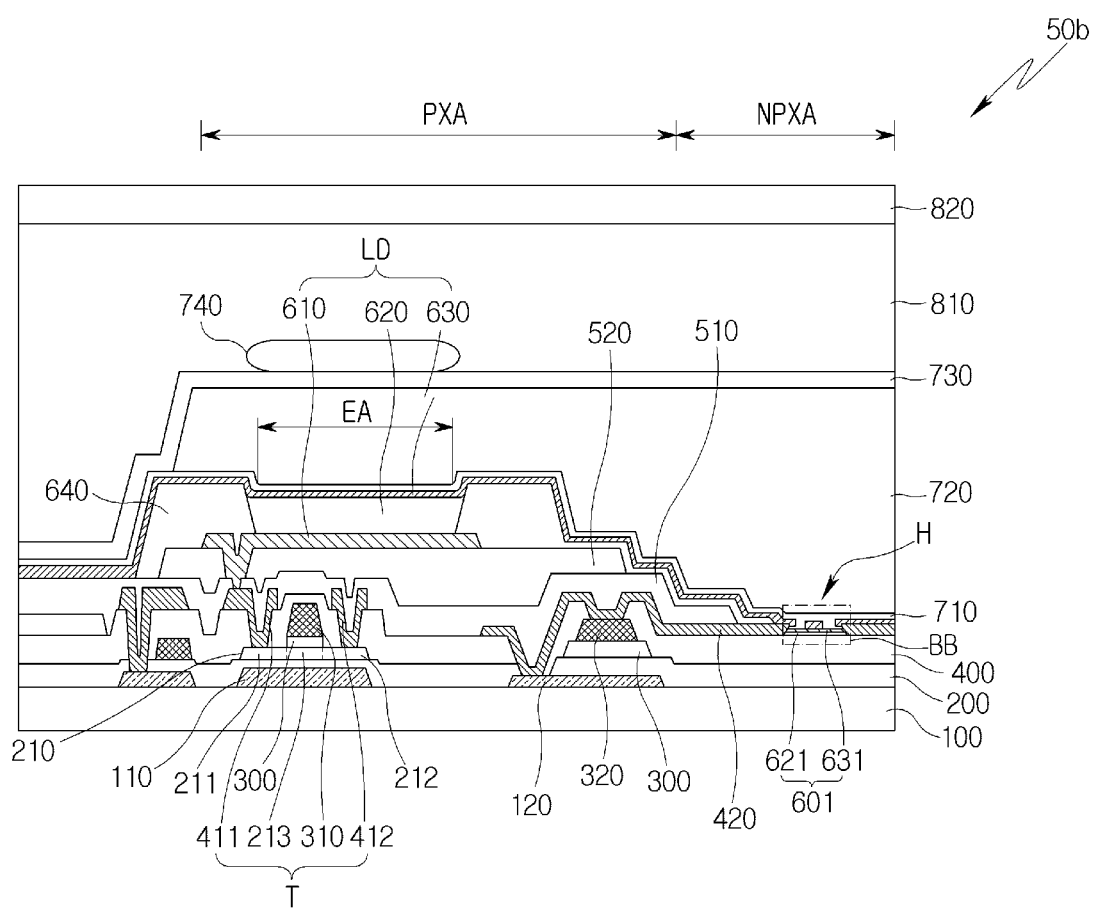
FIG. 13 is a cross-sectional view of a display panel according to another embodiment.
Figure 14:
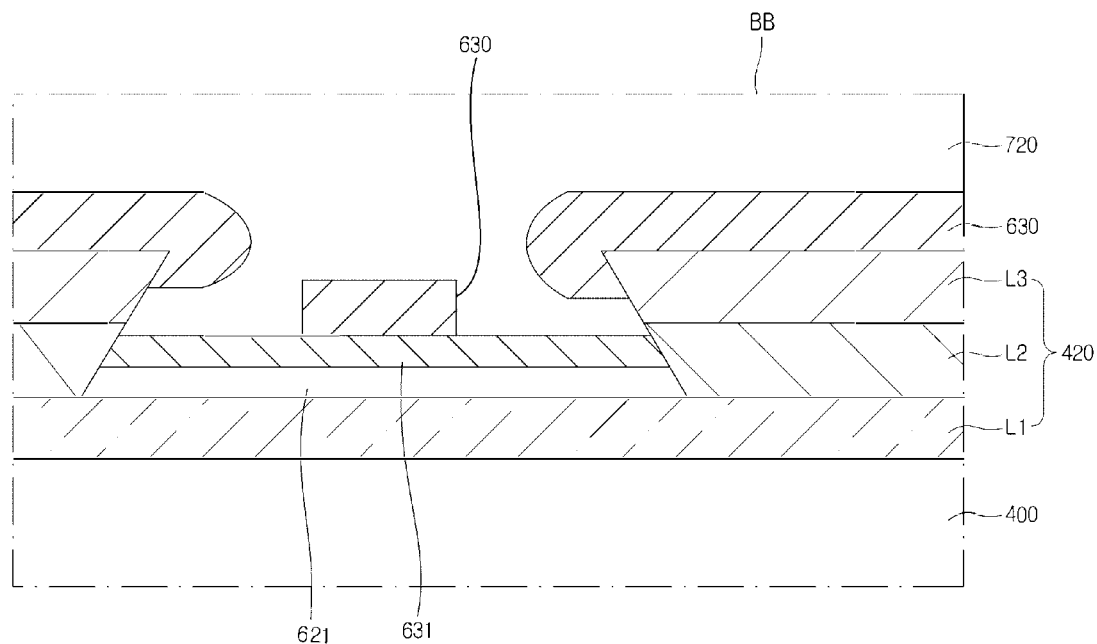
FIG. 14 is an enlarged cross-sectional view of area BB of FIG. 13 according to an embodiment.

FIG. 13 is a cross-sectional view of a display panel according to another embodiment. FIG. 14 is an enlarged cross-sectional view of area BB of FIG. 13. In the embodiment shown in FIG. 13, an emission layer 620 may be formed through a solution process. In describing the embodiment shown in FIG. 13, the same element as in the embodiment shown in FIG. 4 is denoted by the same reference numeral, and a detailed description thereof will be omitted.

Referring to FIG. 13, a display panel 50b includes the second connection electrode 420 formed on the source-drain layer. The second connection electrode 420 is connected to the second power line 120 through the contact hole penetrating through the interlayer insulation layer 400 and the buffer layer 200. Although not shown, the second connection electrode 420 may be further connected to the first connection electrode 320 through the contact hole penetrating through the interlayer insulation layer 400.

The second connection electrode 420 is provided with a hole H formed therein. The hole H is provided to physically divide both the emission layer 620 and the second electrode 630 formed afterward, between adjacent pixel areas PXAs, and a structure in which the second electrode 630 is directly connected to the second connection electrode 420 is provided.

Referring to FIG. 14, the hole H may be formed in such a manner as to be gradually widen in width, starting from the upper surface to the lower surface of the second connection electrode 420. That is, the hole H may have its edge in a reverse-tapered shape. However, this embodiment is not limited thereto. That is, in other embodiments, the side of the hole H may be formed in such a manner as to be substantially perpendicular to the surface of the interlayer insulation layer 400.

In various embodiments, in the case where the second connection electrode 420 has multiple layers, the hole H may be formed in at least one layer. For example, as shown in FIG. 14, the second connection electrode 420 may include the first to the third metal layer L1, L2, and L3. The first metal layer L1 may be made of a material having a high adhesion characteristic to the surface of the interlayer insulation layer 400. The second metal layer L2 may be made of a metal having low resistance. The third metal layer L3 may be made of a material having a strong corrosion resistance. For example, the first metal layer L1 and the third metal layer L3 may be made of an alloy (MoTi) of molybdenum and titanium, and the second metal layer L2 may be made of copper. However, the materials constituting the second connection electrode 420 are not limited thereto.

The hole H may be formed in at least one among the first to the third metal layer L1, L2, and L3 of the second connection electrode 420. For example, as shown in FIG. 14, the hole H may be formed in the second and the third metal layer L2 and L3. In the case where the edge of the hole H has a reverse-tapered shape, the width of the hole H in the third metal layer L3 may be formed in such a manner as to be narrower than the width of the hole H in the second metal layer L2. In this embodiment, in the area where the hole H is formed, the surface of the first metal layer L1 may be exposed.

The hole H may be formed through a wet etching process. For example, the hole H may be formed by using a selective etchant with which the second and the third metal layer L2 and L3 are etched but the first metal layer L1 is not etched. Herein, the reverse-tapered shape may be formed in the second and the third metal layer L2 and L3 due to the difference in etch rates between the second metal layer L2 and the third metal layer L3.

On the second connection electrode 420, the first passivation film 510 may be formed. On the first passivation film 510, the overcoat layer 520 may be formed.

The first electrode 610 is formed on the overcoat layer 520. The first electrode 610 is connected to the drain electrode 411 of the transistor T through the via hole penetrating through the overcoat layer 520 and the first passivation film 510.

The bank 640 may be formed on the overcoat layer 520. The bank 640 may be formed in such a manner that a partial area, for example, a central portion of the first electrode 610 is exposed, but the remaining area, for example, the edge of the first electrode 610, is covered.

At least a part of the surface of the bank 640 may be hydrophobic. For example, the bank 640 may be formed through a photolithography process after applying a solution that is a mixture of an organic insulation material and a hydrophobic material such as fluorine (F). Due the light emitted during the photolithography process, a hydrophobic material, such as fluorine, may move to the top of the bank 640, and accordingly, the top surface of the bank 640 has a hydrophobic property and the remaining portion may have a hydrophilic property. However, the technical idea of this embodiment is not limited thereto. The entire portion of the bank 640 may have hydrophobicity. The hydrophobic bank 640 may serve as a dam that prevents inks from mixing between the pixel areas PXAs when the emission layer 620 is formed through a solution process later.

On the first electrode 610, the emission layer 620 is formed. The emission layer 620 may be formed on the exposed first electrode 610 within the emission area EA surrounded by the bank 640. The emission layer 620 may be formed by dropping an organic solution into a cavity surrounded by the bank 640 with use of a nozzle, or the like, and hardening the organic solution. By the hydrophobic bank 640, the organic solution may be prevented from overflowing to the outside of the area surrounded by the bank 640.

When the emission layer 620 is formed by the solution process, the difference in height of the emission layer 620 between the central area of the emission layer 620 and the edge area adjacent to the bank 640 occurs due to the tension between the organic solution and the bank 640. For example, the emission layer 620 may be formed in a concave shape in which the central portion is lowest and the area being in contact with the bank 640 is highest. However, this embodiment is not limited thereto. That is, in various embodiments, structures (for example, the hydrophilic bank, and the like) for enhancing uniformity in thickness of the emission layer 620 may be placed, and the emission layer 620 may have a uniform height within the emission area EA.

The second electrode 630 may be formed in such a manner as to cover the emission layer 620 and the bank 640. The second electrode 630 may be formed by using physics vapor deposition, such as sputtering. In various embodiments, the second electrode 630 extends to the non-pixel area NPXA and is connected to the exposed second connection electrode 420. For example, the second electrode 630 may be formed in such a manner as to cover a part of the inner surface of the hole H while being deposited with physics vapor deposition, and may be connected to the second connection electrode 420.

As shown in FIG. 14, a bather 601 may be formed inside the hole H. The bather 601 may be formed together in a manufacturing process of the upper layers of the second connection electrode 420. For example, the barrier 601 may include the first layer 621 and the second layer 631. The first layer 621 may be made of the same material as the first passivation film 510 and may be formed through the same process as the same. The second layer 631 may be made of the same material as the first electrode 610 and may be formed through the same process as the same. However, the materials constituting the bather 601 are not limited thereto. The bather 601 may be formed through a separate process from the upper layers.

On the bather 601, a part of the second electrode 630 deposited after forming the bather 601 may be formed. Compared with the embodiment shown in FIG. 4, in the embodiment shown in FIG. 13, the emission layer 620 is not formed on the barrier 601. In the embodiment shown in FIG. 13, the emission layer 620 may be selectively applied through a solution process to the emission area EA surrounded by the bank 640, and may not be applied to the top of the barrier 601.

FIGS. 15 to 18 are diagrams showing a method of manufacturing the display panel shown in FIG. 13.

Figure 15:
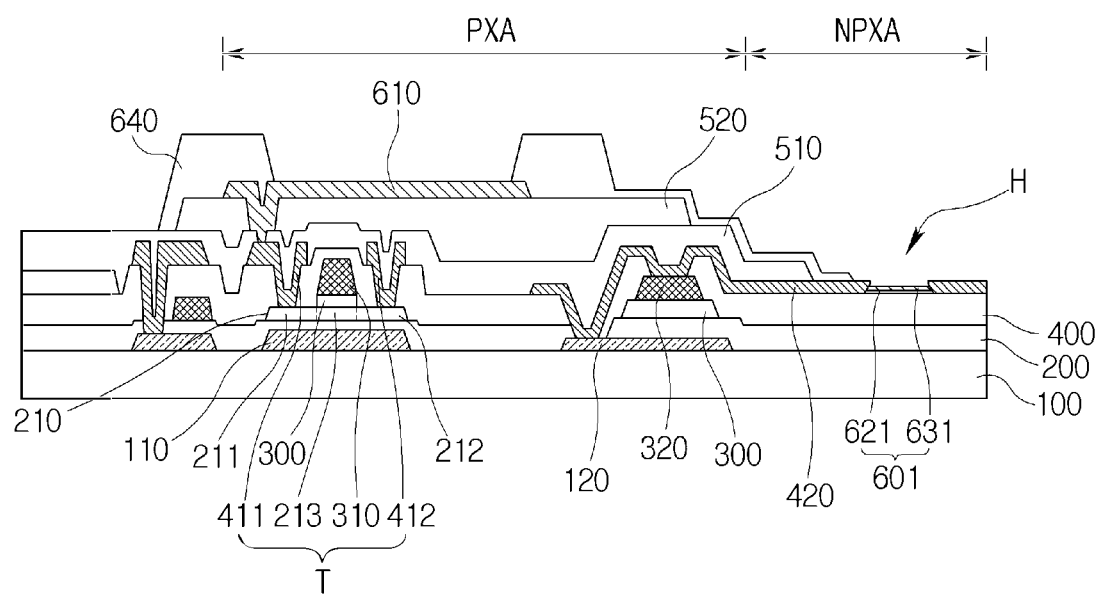
FIGS. 15 to 18 are diagrams showing a method of manufacturing the display panel shown in FIG. 13 according to an embodiment.

Referring to FIG. 15, on the substrate 100, the light blocking layer 110 and the second power line 120 are formed, and the buffer layer 200 is formed thereon. On the buffer layer 200, the active pattern 210 is formed. P-type or n-type impurities are doped into the active pattern 210, so that the source region 212 and the drain region 211 are formed. The channel 213 may be formed between the source region 212 and the drain region 211.

On the active pattern 210, the gate insulation layer 300 may be formed. The gate insulation layer 300 may be formed at positions connected to the gate electrode 310 and the first connection electrode 320, respectively. On the gate insulation layers 300, the gate electrode 310 and the first connection electrode 320 are formed. Afterward, the interlayer insulation layer 400 is formed. The interlayer insulation layer 400 may cover the gate electrode 310 and the first connection electrode 320.

On the interlayer insulation layer 400, the source electrode 412 and the drain electrode 411 may be formed. The source electrode 412 and the drain electrode 411 may be connected to the source region 212 and the drain region 211 of the active pattern 210 through the contact holes penetrating through the interlayer insulation layer 400, respectively.

On the interlayer insulation layer 400, the second connection electrode 420 may be further formed. The second connection electrode 420 is connected to the second power line 120 through the contact hole penetrating through the interlayer insulation layer 400 and the buffer layer 200. Although not shown, the second connection electrode 420 may be further connected to the first connection electrode 320 through the contact hole penetrating through the interlayer insulation layer 400. The second connection electrode 420 may be provided with a hole H formed therein. The hole H may be formed in such a manner as to be in a reverse-tapered shape through a wet etching process.

Afterward, the first passivation film 510 may be formed. The first passivation film 510 may cover the source electrode 412, the drain electrode 411, and the second connection electrode 420. When the first passivation film 510 is formed, a part of the material of the first passivation film 510 is deposited inside the hole H and the first layer 621 of the bather 601 is formed.

On the first passivation film 510, the overcoat layer 520 is formed. The bank 640 may be formed in a pattern in such a manner as to be formed in the pixel area PXA. This overcoat layer 520 does not cover the hole H.

Afterward, on the overcoat layer 520, the first electrode 610 is formed. The first electrode 610 is connected to the drain electrode 411 through the via hole penetrating through the overcoat layer 520 and the first passivation film 510. When the first electrode 610 is formed, a part of the material of the first electrode 610 is deposited inside the hole H and the second layer 631 of the bather 601 is formed.

Afterward, the bank 640 is formed. The bank 640 may be formed to cover the edge of the first electrode 610 and the overcoat layer 520. The bank 640 may be formed in the pixel area PXA. This bank 640 does not cover the hole H. In various embodiments, the bank 640 may be formed through a photolithography process after applying a solution that is a mixture of an organic insulation material and a hydrophobic material such as fluorine (F). Due the light emitted during the photolithography process, a hydrophobic material, such as fluorine, may move to the top of the bank 640, and accordingly, the top surface of the bank 640 has a hydrophobic property and the remaining portion may have a hydrophilic property. However, the technical idea of this embodiment is not limited thereto. The entire portion of the bank 640 may have hydrophobicity. The hydrophobic bank 640 may serve as a dam that prevents inks from mixing between the pixel areas PXAs when the emission layer 620 is formed through a solution process later.

Figure 16:
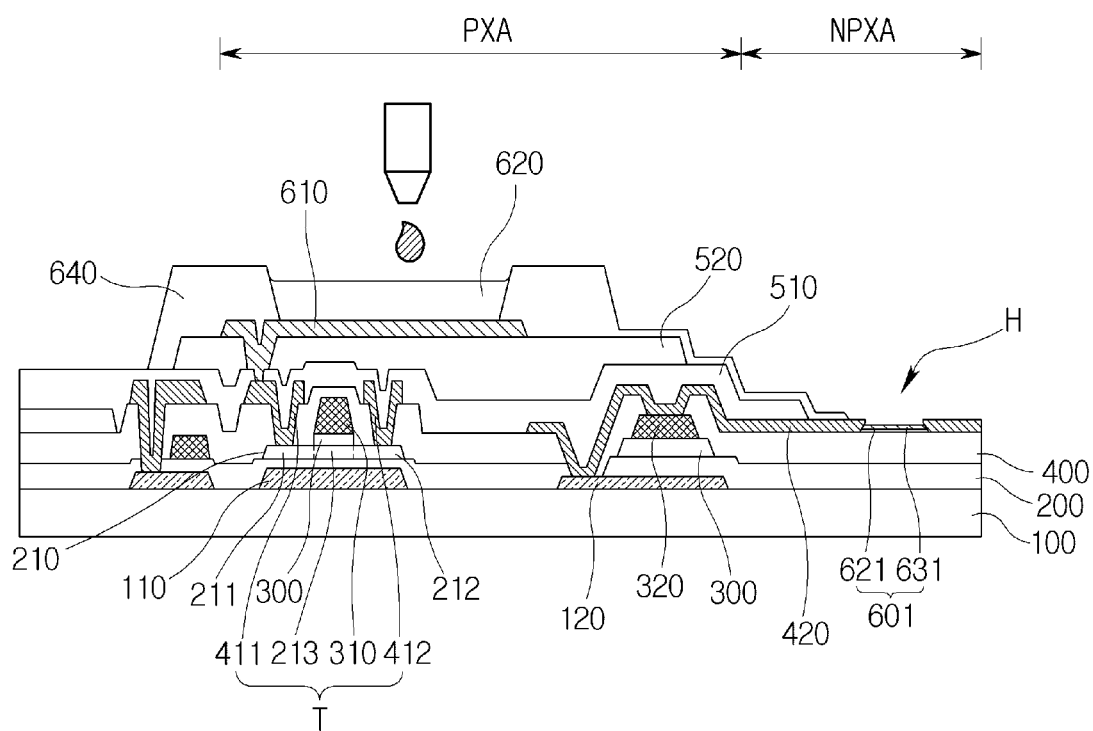

Referring to FIG. 16, on the first electrode 610 and the bank 640, the emission layer 620 is formed. The emission layer 620 may be formed on the exposed first electrode 610 within the emission area EA surrounded by the bank 640. The emission layer 620 may be formed by dropping an organic solution into a cavity surrounded by the bank 640 with use of a nozzle, or the like, and hardening the organic solution. By the hydrophobic bank 640, the organic solution may be prevented from overflowing to the outside of the area surrounded by the bank 640.

Figure 17:
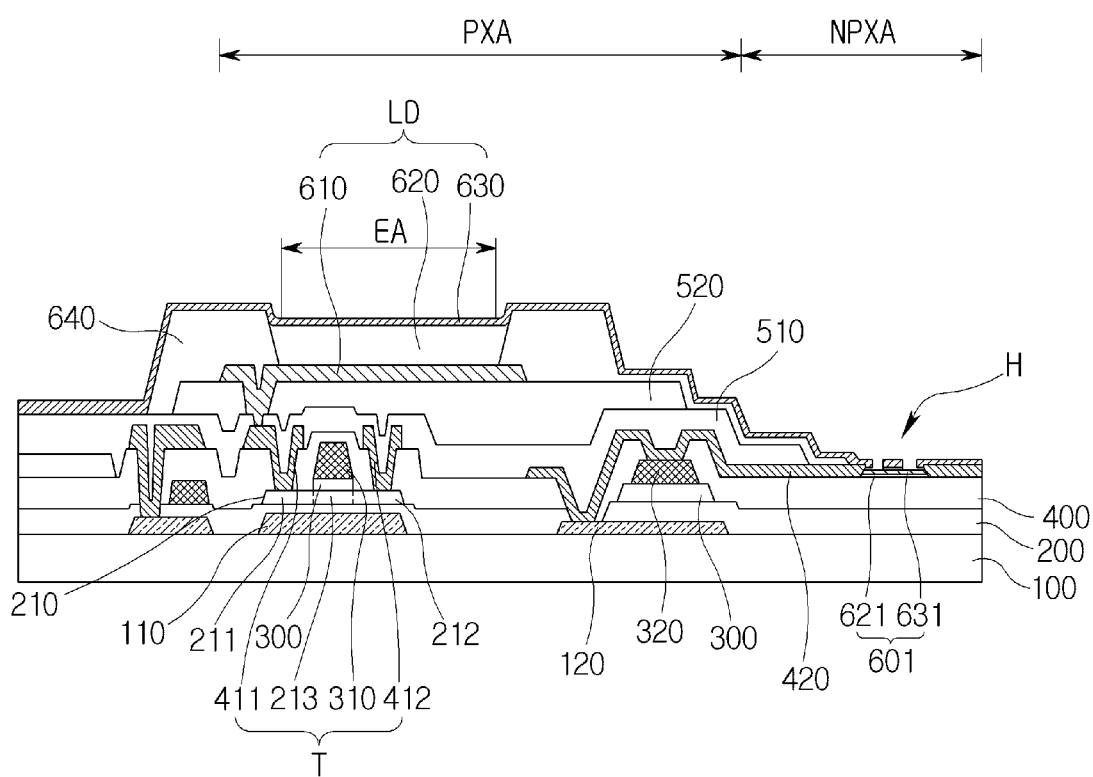

Referring to FIG. 17, on the emission layer 620, the second electrode 630 is formed. The second electrode 630 may be formed by using physics vapor deposition, such as sputtering. The second electrode 630 is physically divided by the hole H and is formed in a discontinuous shape. Due to the relatively good step coverage characteristic of the second electrode 630, the second electrode 630 is formed covering a part of the inner surface of the hole H. Accordingly, the second electrode 630 may be connected to the second connection electrode 420. On the exposed surface inside the hole H, the second electrode 630 may be deposited.

Figure 18:
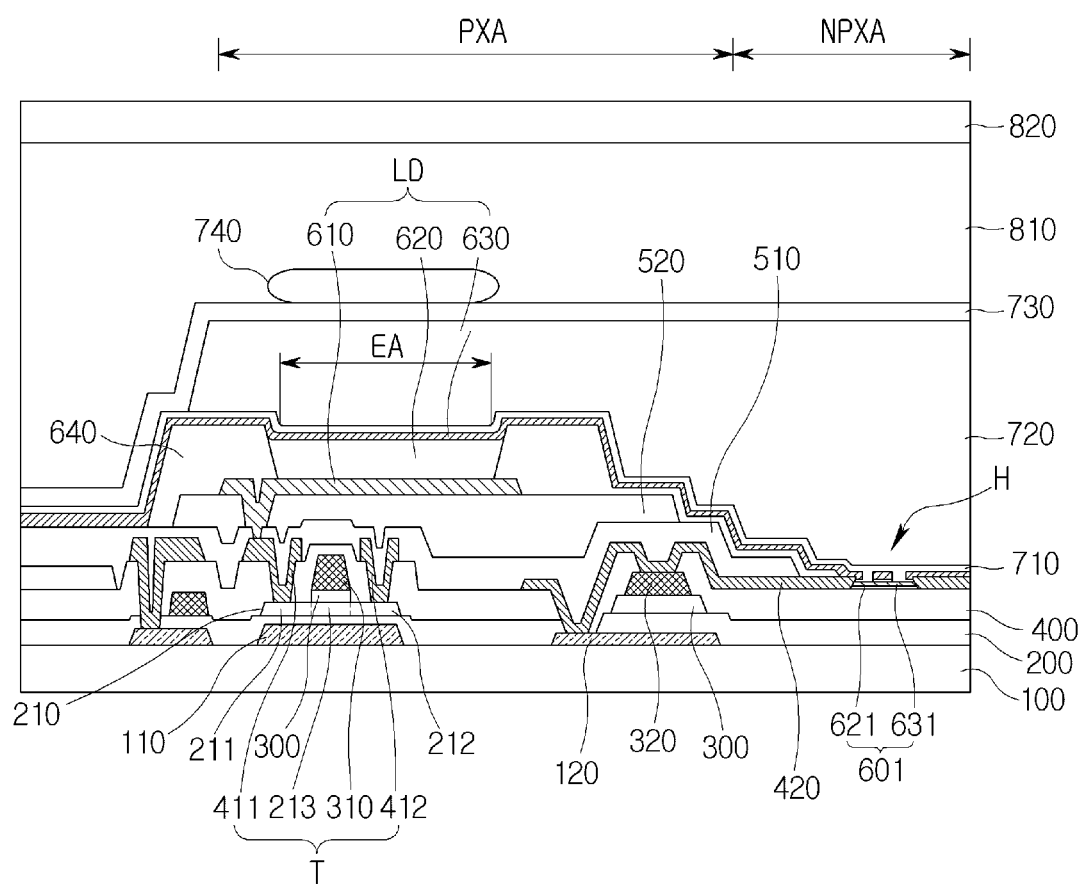

Referring to FIG. 18, the second passivation film 710, the first cover layer 720, and the third passivation film 730 may be formed in order. On the third passivation film 730, the color filter 740 may be further formed. On the color filter 740, the second cover layer 810 is further formed, and the upper substrate 820 is bonded through an adhesive, or the like.

It will be understood by those skilled in the art that the present disclosure can be embodied in other specific forms without changing the technical idea or essential characteristics of the present disclosure. Therefore, it should be understood that the embodiments described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A method of manufacturing a display device, the method comprising:
    forming a power line on a substrate;
    forming at least one insulation layer covering the power line;
    forming a connection electrode that has at least an area placed in a non-pixel area of the substrate, the connection electrode connected to the power line through a contact hole;
    forming a hole in the connection electrode in the non-pixel area;
    forming an overcoat layer in a pixel area disposed adjacent to the non-pixel area; and
    forming a first electrode on the overcoat layer;
    forming an emission layer on the first electrode;
    forming a second electrode on the emission layer, and
    wherein the second electrode extends from the pixel area to the non-pixel area,
    wherein the second electrode is connected to the connection electrode in the non-pixel area, and
    wherein the first electrode is disposed on a different layer from the connection electrode, and
    wherein the second electrode overlap the emission layer in the pixel area,
    wherein the connection electrode comprises a first metal layer, a second metal layer and a third metal layer, an inner surface of the hole has a reverse-tapered shape of the second and third metal layers, the second electrode contacts only the third metal layer, and the second electrode contacts an inner side surface of the third metal layer, and
    the hole completely penetrates the second metal layer and the third metal layer.

2. The method of claim 1, wherein the forming of the connection electrode comprises forming multiple metal layers, and
    the forming of the hole is performed through a wet etch process using a selective etchant with which one or more metal layers among the multiple metal layers are etched.

3. The method of claim 1, after the forming of the overcoat layer, further comprising:
    forming a bank covering an area of the first electrode.

4. The method of claim 3, wherein the emission layer is formed in such a manner as to cover the second electrode and the bank, the emission layer extending to the non-pixel area.

5. The method of claim 3, wherein the forming of the bank comprises:
  applying, to an area in which the bank is to be formed, a solution that is a mixture of an organic insulation material and a hydrophobic material; and
  performing photolithography.

6. The method of claim 5, wherein the forming of the emission layer comprises:
  dropping an organic solution into an area surrounded by the bank; and
  hardening the organic solution.

7. The method of claim 3, wherein the forming of the second electrode is performed by using physics vapor deposition.

8. The method of claim 1, wherein the display device further comprises a barrier layer in the hole, and the barrier layer directly contacts the inner side surface of the third metal layer, and does not contact an inner side surface of the second metal layer.

9. The method of claim 1, wherein the display device further comprises a barrier layer in the hole, and the barrier layer comprises a first barrier layer, and a second barrier layer disposed on the first barrier layer.

10. The method of claim 9, wherein the display device further comprises a passivation layer between the connection electrode and the overcoat layer, and the first barrier layer disposed on a same layer of the passivation layer, and the second barrier layer disposed on a same layer of the first electrode.

* * * * *